United States Patent
Min

(10) Patent No.: US 8,946,743 B2
(45) Date of Patent: Feb. 3, 2015

(54) LIGHT EMITTING APPARATUS

(75) Inventor: Bong Kul Min, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 320 days.

(21) Appl. No.: 12/904,441

(22) Filed: Oct. 14, 2010

(65) Prior Publication Data

US 2011/0089453 A1    Apr. 21, 2011

(30) Foreign Application Priority Data

Oct. 15, 2009    (KR) .................. 10-2009-0098474
Feb. 8, 2010    (KR) .................. 10-2010-0011445

(51) Int. Cl.
    *H01L 33/00*       (2010.01)
    *H01L 33/58*       (2010.01)
                (Continued)

(52) U.S. Cl.
    CPC ............... *H01L 33/58* (2013.01); *H01L 33/60* (2013.01); *G02B 19/0071* (2013.01);
                (Continued)

(58) Field of Classification Search
    USPC ............ 257/81, 98–100, 676, 678, 687, 787, 257/790, E33.056, E33.058, E33.062, 257/E21.499, E21.502, E21.504; 438/22, 438/25–27, 29, 64, 65, 69, 106, 124–127; 359/362, 364, 366, 642, 726, 727; 362/327, 328, 334–336, 341, 347, 362, 362/364
See application file for complete search history.

(56) References Cited

U.S. PATENT DOCUMENTS 7,436,066 B2 * 10/2008 Sonobe et al. ................ 257/767
7,458,703 B2 * 12/2008 Han et al. ...................... 362/267

(Continued)

FOREIGN PATENT DOCUMENTS

EP    1 717 627 A1    11/2006
EP    1 818 706 A1    8/2007

(Continued)

OTHER PUBLICATIONS

European Search Report dated May 31, 2011 issued in Application No. 10 18 7347.

(Continued)

*Primary Examiner* — Meiya Li
(74) *Attorney, Agent, or Firm* — Ked & Associates, LLP

(57) ABSTRACT

Disclosed is a light emitting apparatus. The light emitting apparatus includes a package body; first and second electrodes; a light emitting device electrically connected to the first and second electrodes and including a first conductive semiconductor layer, a second conductive semiconductor layer, and an active layer between the first and second conductive semiconductor layers; and a lens supported on the package body and at least a part of the lens including a reflective structure. The package body includes a first cavity, one ends of the first and second electrodes are exposed in the first cavity and other ends of the first and second electrodes are exposed at lateral sides of the package body, and a second cavity is formed at a predetermined portion of the first electrode exposed in the first cavity.

21 Claims, 17 Drawing Sheets

(51) Int. Cl.
  *H01L 33/60* (2010.01)
  *G02B 19/00* (2006.01)
  *H01L 25/075* (2006.01)

(52) U.S. Cl.
  CPC ....... *G02B 19/0095* (2013.01); *G02B 19/0028* (2013.01); *G02B 19/0061* (2013.01); *H01L 25/0753* (2013.01); *H01L 2224/48091* (2013.01); *H01L 2224/48247* (2013.01); *H01L 2224/8592* (2013.01)
  USPC ............... 257/98; 257/81; 257/100; 257/676; 257/687; 257/678; 257/787; 257/790; 257/E33.056; 257/E33.058; 257/E33.062; 257/E21.499; 257/E21.502; 257/E21.504; 438/22; 438/25; 438/27; 438/29; 438/64; 438/106; 438/124; 438/127; 359/362; 359/364; 359/366; 359/642; 359/726; 362/327; 362/328; 362/334; 362/341; 362/362

(56) References Cited

U.S. PATENT DOCUMENTS

| | | | |
|---|---|---|---|
| 2006/0238884 A1* | 10/2006 | Jang et al. | 359/653 |
| 2006/0273337 A1 | 12/2006 | Han et al. | 257/98 |
| 2007/0019416 A1 | 1/2007 | Han et al. | |
| 2007/0023777 A1 | 2/2007 | Sonobe et al. | |
| 2007/0109952 A1* | 5/2007 | Jeong et al. | 369/275.4 |
| 2007/0195534 A1 | 8/2007 | Ha et al. | 362/327 |
| 2007/0215890 A1* | 9/2007 | Harbers et al. | 257/98 |
| 2007/0246715 A1 | 10/2007 | Shin et al. | |
| 2008/0073663 A1* | 3/2008 | Chang | 257/99 |
| 2008/0088226 A1* | 4/2008 | Sohn et al. | 313/503 |
| 2008/0224162 A1 | 9/2008 | Min et al. | 257/98 |
| 2009/0058256 A1* | 3/2009 | Mitsuishi et al. | 313/487 |
| 2009/0273727 A1 | 11/2009 | Kubota et al. | |
| 2010/0224895 A1 | 9/2010 | Murazaki et al. | 257/98 |
| 2010/0225226 A1 | 9/2010 | Murazaki et al. | |

FOREIGN PATENT DOCUMENTS

| | | |
|---|---|---|
| EP | 1 930 959 A1 | 6/2008 |
| EP | 2 031 296 A1 | 3/2009 |
| EP | 2 058 679 A2 | 5/2009 |
| EP | 2 104 149 A1 | 9/2009 |
| JP | 2007-048883 A | 2/2007 |
| JP | 2007-088248 A | 4/2007 |
| JP | 2007-102139 A | 4/2007 |
| KR | 10-2007-0021873 | 2/2007 |
| KR | 10-2008-0087405 | 10/2008 |
| KR | 10-2009-0101580 A | 9/2009 |
| WO | WO 2009/028657 A1 | 3/2009 |

OTHER PUBLICATIONS

European Search Report dated Dec. 13, 2012.

* cited by examiner

LIGHT EMITTING APPARATUS

The present application claims priorities of Korean Patent Application Nos. 10-2009-0098474 filed on Oct. 15, 2009, and 10-2010-0011445 filed on Feb. 8, 2010, which are hereby incorporated by reference in their entirety.

BACKGROUND

The embodiment relates to a light emitting apparatus.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq x \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED using the nitride semiconductor material is mainly used for the light emitting devices to provide the light. For instance, the LED using nitride semiconductor material is used as a light source for various products, such as a keypad light emitting part of a cellular phone, an electric signboard, and a lighting device.

Such an LED is disposed on the light emitting apparatus by processing an encapsulating member or a lens in various shapes to adjust the distribution characteristic of light emitted from the light emitting device.

SUMMARY

The embodiment provides a light emitting apparatus having a novel structure.

The embodiment provides a light emitting apparatus including a lens having a novel structure.

The embodiment provides a light emitting apparatus having a wide orientation angle.

A light emitting apparatus according to the embodiment may include a package body; first and second electrodes; a light emitting device electrically connected to the first and second electrodes and including a first conductive semiconductor layer, a second conductive semiconductor layer, and an active layer between the first and second conductive semiconductor layers; and a lens supported on the package body and at least a part of the lens including a reflective structure, wherein the package body includes a first cavity, one ends of the first and second electrodes are exposed in the first cavity and other ends of the first and second electrodes are exposed at lateral sides of the package body, and a second cavity is formed at a predetermined portion of the first electrode exposed in the first cavity.

A light emitting apparatus according to the embodiment may includes a substrate; a light emitting device package on the substrate; and a lens supported by the substrate on the light emitting device package and including a reflective structure, wherein the lens includes a lens body having a first recess and a lens supporter supporting the lens body such that the lens body is spaced apart from the substrate A light emitting apparatus according to the embodiment may include a substrate; a light emitting device on the substrate and including a first conductive semiconductor layer, a second conductive semiconductor layer, and an active layer between the first and second conductive semiconductor layers; an encapsulant on the substrate and the light emitting device to surround the light emitting device; and a lens supported by the substrate on the light emitting device and including a reflective structure.

A light emitting apparatus according to the embodiment may include a substrate; a light emitting device on the substrate and including a first conductive semiconductor layer, a second conductive semiconductor layer, and an active layer between the first and second conductive semiconductor layers; an encapsulant on the substrate and the light emitting device to surround the light emitting device; a lens supported by the substrate on the light emitting device and including a recess; and a luminescent material formed on at least one of the lens and/or the encapsulant to absorb a light emitted from the light emitting device so as to convert the light into another type of light, wherein the luminescent material includes a first luminescent material and a second luminescent material, the first and second luminescent materials emit lights having different frequency bands by absorbing the light emitted from the light emitting device, and a proportion of the first luminescent material is higher than a proportion of the second luminescent material.

DETAILED DESCRIPTION OF THE EMBODIMENTS

Figure 1:
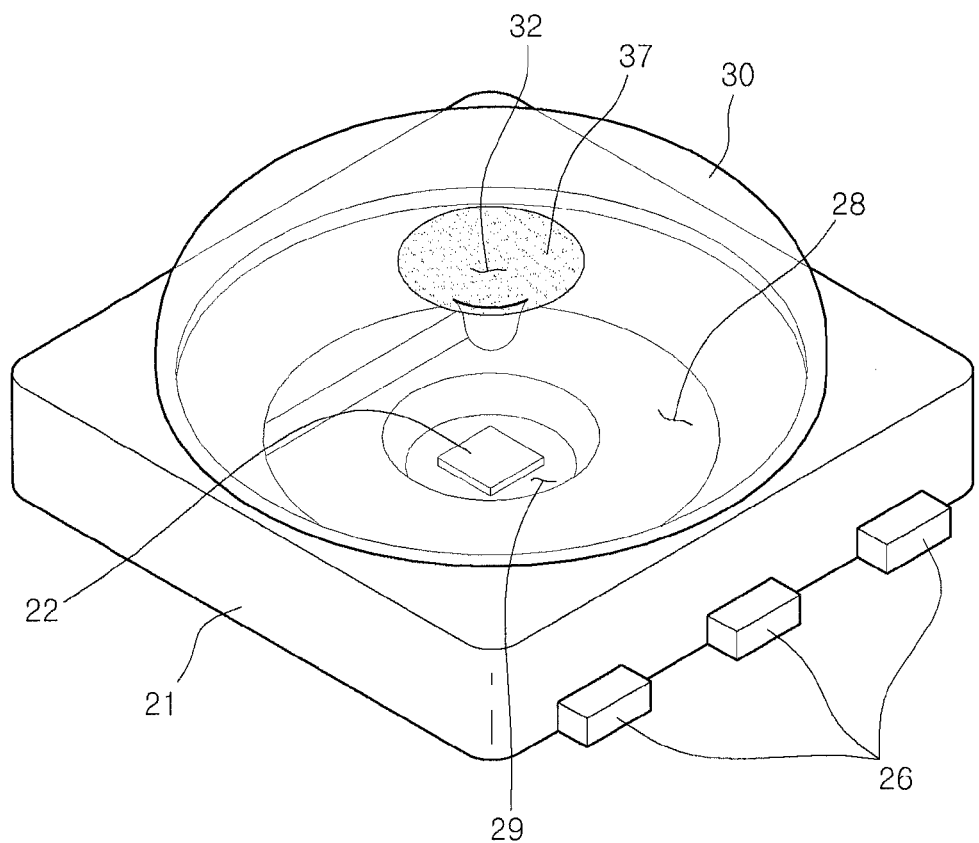
FIG. 1 is a perspective view showing a light emitting apparatus according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting apparatus according to the embodiments will be described in detail with reference to the accompanying drawings.

First Embodiment

Figure 2:
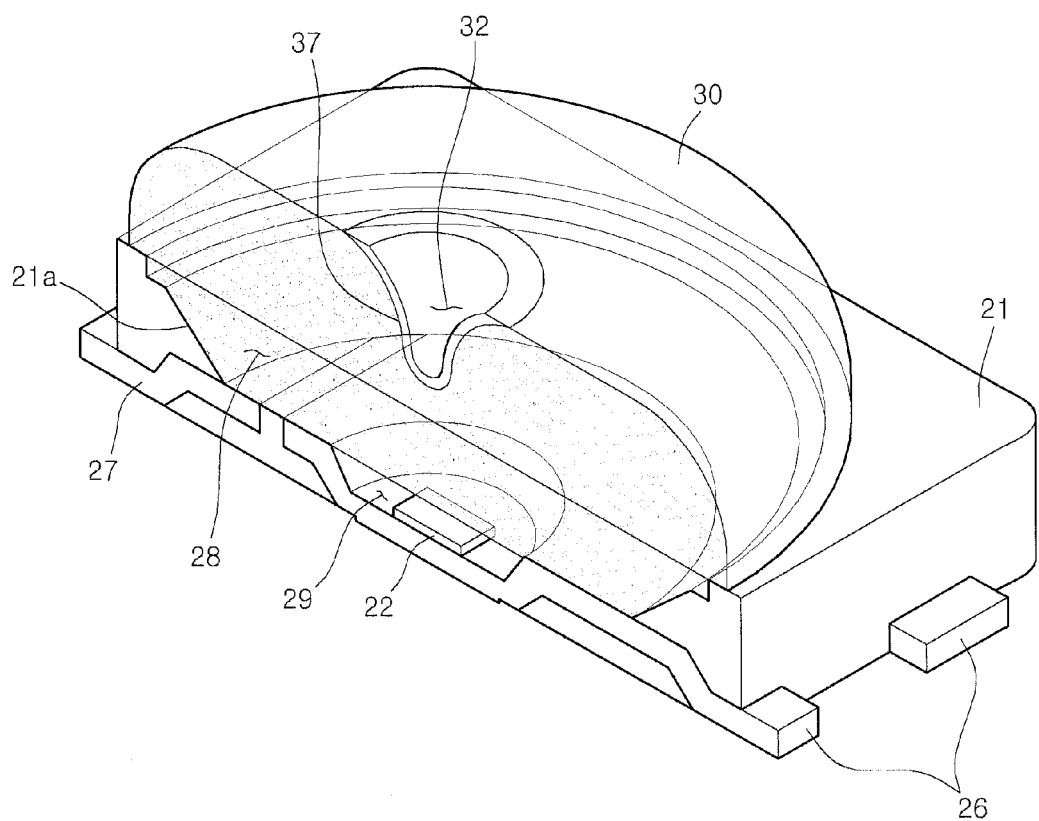
FIG. 2 is a sectional perspective view showing a light emitting apparatus according to the first embodiment.

FIG. 1 is a perspective view showing a light emitting apparatus according to the first embodiment, and FIG. 2 is a sectional perspective view showing the light emitting apparatus according to the first embodiment.

Referring to FIGS. 1 and 2, the light emitting apparatus according to the first embodiment includes a first electrode 26, a second electrode 27, a package body 21, a light emitting device 22, and a lens 30.

The package body 21 can be formed by using polymer resin, which is suitable for injection molding. The polymer resin includes, for example, PPA (polyphthalamide) or LCP (liquid crystal polymer). The material for the package body 21 may not be limited to the polymer resin, but various resin materials, such as silicone, can be used for the package body 21. In addition, the package body 21 may include a ceramic material.

According to the embodiment, the package body 21 has a substantially rectangular hexahedral structure formed at an upper portion thereof with a first cavity 28.

The first electrode 26 is electrically isolated from the second electrode 27. One ends of the first and second electrodes 26 and 27 are exposed in the first cavity 28 and the other ends of the first and second electrodes 26 and 27 are exposed at both lateral sides of the package body 21.

According to the embodiment, each of the first and second electrodes 26 and 27 is divided into three parts at both lateral sides of the package body 21, but the embodiment is not limited thereto. The first and second electrodes 26 and 27 may be divided into two parts or may not be divided.

The three divided parts of the first and second electrodes 26 and 27 are electrically connected with each other in the package body 21.

At least a part of bottom surfaces of the first and second electrodes 26 and 27 is disposed on the same plane with a bottom surface of the package body 21. In addition, at least two parts of the bottom surface of the first electrode 26 may be disposed on the same plane with the bottom surface of the package body 21.

In addition, the center of the first electrode 26, which is exposed in the first cavity 28, is concaved downward to form a second cavity 29. The bottom surface of the first electrode 26 corresponding to the second cavity 29 protrudes downward from the package body 21.

The first and second electrodes 26 and 27 not only supply power to the light emitting device 22, but also dissipate heat generated from the light emitting device 22 and reflect light emitted from the light emitting device 22.

The light emitting device 22 is installed on the first electrode 26. For instance, the light emitting device 22 may include a light emitting diode chip having an n type semiconductor layer, an active layer and a p type semiconductor layer. The light emitting device 22 may include a color light emitting diode chip, such as a blue light emitting diode chip, a red light emitting diode chip or a green light emitting diode chip, or a UV light emitting diode chip that emits UV light. Various types of light emitting diode chips can be employed for the light emitting device 22.

The light emitting device 22 is electrically connected to the first and second electrodes 26 and 27 through a wire (not shown). For instance, a part of the light emitting device 22 is connected to the second electrode 27 through the wire and a remaining part of the light emitting device 22 is electrically connected to the first electrode 26 by directly making contact with the first electrode 26.

The light emitting device 22 may be installed in the second cavity 29 of the first electrode 26.

The first cavity 28 defined in the package body 21 and the second cavity 29 defined in the first electrode 26 are prepared in the form of recesses having circular shapes or polygonal shapes when viewed from the top thereof. In addition, inner walls of the first and second cavities 28 and 29 may be inclined to allow the light generated from the light emitting device 22 to be easily emitted to the outside. Further, a reflective material can be formed on an inclined surface 21a of the first cavity 28.

The lens 30 is installed on the light emitting device 22 to change an orientation angle of light, which is emitted from the light emitting device 22 or reflected from the inner peripheral walls of the first and second cavities 28 and 29. For instance, the lens 30 includes silicone resin or epoxy resin.

At least a part of the lens 30 may include a luminescent material. In addition, at least a part of the light emitting device 22 provided under the lens 30 may include the luminescent material. In detail, the luminescent material can be formed on the surface of the light emitting device 22 or can be formed between the light emitting device 22 and the lens 30 while being spaced apart from the light emitting device 22.

The lens 30 may not be formed in the first and second cavities 28 and 29. In this case, the lens 30 is supported by the package body 21 such that the lens 30 can be disposed over the light emitting device 22. Further, the lens 30 can be formed in the first cavity 28 without being formed in the second cavity 29 such that the lens 30 can be disposed over the light emitting device 22 and spaced from the light emitting device 22. In addition, the lens 30 can be formed in the first and second cavities 28 and 29 while making contact with the top surface of the light emitting device 22. The position of the lens 30 can be variously selected such that the lens 30 can make contact with the light emitting device 22 or can be spaced apart from the light emitting device 22.

The lens 30 is injected into the package body 21 under the semi-cured state or coupled with the package body 21 under the cured state. The lens 30 has a convex structure and a recess 32, which is concaved downward, is formed at the center of the lens 30. For instance, the lens 30 exposed out of the package body 21 may have a hemispherical shape and the recess 32 is formed on the lens 30 while overlapping with the light emitting device 22 in the vertical direction.

At least a part of the lens 30 includes a reflective structure 37. For instance, the reflective structure 37 can be formed in the recess 32. The reflective structure 37 has an area corresponding to 5% to 60% based on an area of the upper surface of the lens 30. The recess 32 may be fully or partially filled with the reflective structure 37. Since the reflective structure 37 is formed in the recess 32, the light emitted from the light emitting device 22, the light reflected from the inner peripheral wall and the bottom surface of the first cavity 28, or the light directed toward the recess 32 after reflected from the inner peripheral wall and the bottom surface of the first cavity 28 can be reflected from the reflective structure 37 so that the light is traveled in the lateral direction of the lens 30.

Therefore, the light emitted from the light emitting device 22, and the light reflected from the inner peripheral walls and the bottom surfaces of the first and second cavities 28 and 29 are emitted to the outside through the outer peripheral portion of the lens 30, that is, the region of the lens 30 where the reflective structure 37 is not formed.

Thus, since the light can be emitted to the outside through the outer peripheral portion of the lens 30, the light emitting apparatus according to the first embodiment can supply light with wide orientation angle.

For instance, the reflective structure 37 can be obtained by mixing organic substance having transmissivity of 70% or more with inorganic substance capable of reflecting or scattering the light. The inorganic substance may include at least one of $TiO_2$, $SiO_2$, Al, $Al_2O_3$, and Ag. The reflective structure 37 can totally or partially reflect the light according to the mixing ratio between the organic substance and the inorganic substance. The mixing ratio between the organic substance and the inorganic substance is in the range of 1:0.001 to 1:1.

In addition, for example, the reflective structure 37 may include a deposition layer formed by using at least one of $SiO_2$, $TiO_2$, Al, Ag, and Ti. The deposition layer may have a thickness about 100 Å or above.

According to the light emitting apparatus of the first embodiment, the recess 32 is formed on the lens 30 while overlapping with the light emitting device 22 in the vertical direction and the reflective structure 37 is formed in the recess 32, so that the orientation angle of the light emitted from the light emitting device 22 can be adjusted.

Figure 3:
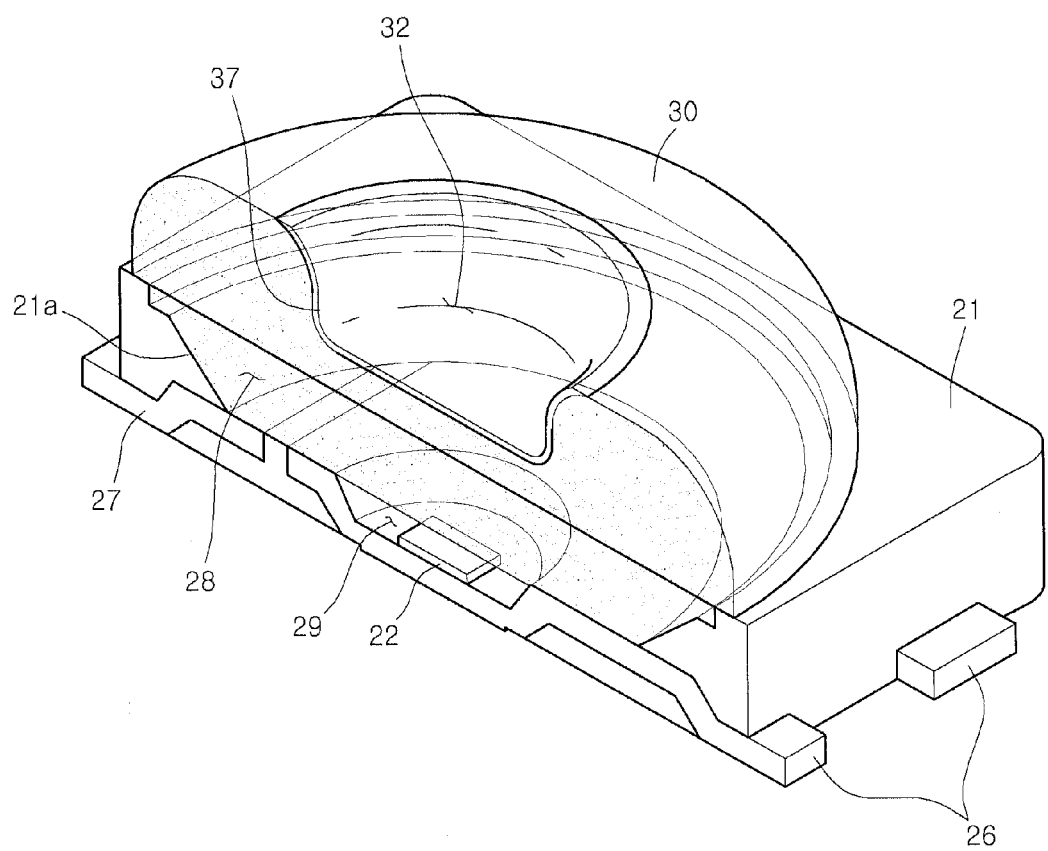
FIG. 3 is a sectional perspective view showing another example of a light emitting apparatus according to the first embodiment.

FIG. 3 is a sectional perspective view showing another example of the light emitting apparatus according to the first embodiment. The light emitting apparatus shown in FIG. 1 includes a first electrode 26, a second electrode 27, a package body 21, a light emitting device 22, and a lens 30.

The package body 21 can be formed by using polymer resin, which is suitable for injection molding. The polymer resin includes, for example, PPA (polyphthalamide amide) or LCP (liquid crystal polymer). The material for the package body 21 may not be limited to the polymer resin, but various resin materials, such as silicone, can be used for the package body 21. In addition, the package body 21 may include a ceramic material.

According to the embodiment, the package body 21 has a substantially rectangular hexahedral structure formed at an upper portion thereof with a first cavity 28.

The first electrode 26 is electrically isolated from the second electrode 27. One ends of the first and second electrodes 26 and 27 are exposed in the first cavity 28 and the other ends of the first and second electrodes 26 and 27 are exposed at both lateral sides of the package body 21.

According to the embodiment, each of the first and second electrodes 26 and 27 is divided into three parts at both lateral sides of the package body 21, but the embodiment is not limited thereto. The first and second electrodes 26 and 27 may be divided into two parts or may not be divided. The three divided parts of the first and second electrodes 26 and 27 are electrically connected with each other in the package body 21.

At least a part of bottom surfaces of the first and second electrodes 26 and 27 is disposed on the same plane with a bottom surface of the package body 21. In addition, at least two parts of the bottom surface of the first electrode 26 may be disposed on the same plane with the bottom surface of the package body 21.

In addition, the center of the first electrode 26, which is exposed in the first cavity 28, is concaved downward to form a second cavity 29. The bottom surface of the first electrode 26 corresponding to the second cavity 29 protrudes downward from the package body 21.

The first and second electrodes 26 and 27 not only supply power to the light emitting device 22, but also dissipate heat generated from the light emitting device 22 and reflect light emitted from the light emitting device 22.

The light emitting device 22 is installed on the first electrode 26. For instance, the light emitting device 22 may include a light emitting diode chip having an n type semiconductor layer, an active layer and a p type semiconductor layer. The light emitting device 22 may include a color light emitting diode chip, such as a blue light emitting diode chip, a red light emitting diode chip or a green light emitting diode chip, or a UV light emitting diode chip that emits UV light. Various types of light emitting diode chips can be employed for the light emitting device 22.

The light emitting device 22 is electrically connected to the first and second electrodes 26 and 27 through a wire (not shown). For instance, a part of the light emitting device 22 is connected to the second electrode 27 through the wire and a remaining part of the light emitting device 22 is electrically connected to the first electrode 26 by directly making contact with the first electrode 26.

The light emitting device 22 may be installed in the second cavity 29 of the first electrode 26.

The first cavity 28 defined in the package body 21 and the second cavity 29 defined in the first electrode 26 are prepared in the form of recesses having circular shapes or polygonal shapes when viewed from the top thereof. In addition, inner walls of the first and second cavities 28 and 29 may be inclined to allow the light generated from the light emitting device 22 to be easily emitted to the outside.

Further, a reflective material can be formed on an inclined surface 21a of the first cavity 28.

The lens 30 is installed on the light emitting device 22 to change an orientation angle of light, which is emitted from the light emitting device 22 or reflected from the inner peripheral walls of the first and second cavities 28 and 29. For instance, the lens 30 includes silicone resin or epoxy resin.

At least apart of the lens 30 may include a luminescent material.

In addition, at least a part of the light emitting device 22 provided under the lens 30 may include the luminescent material. In detail, the luminescent material can be formed on the surface of the light emitting device 22 or can be formed between the light emitting device 22 and the lens 30 while being spaced apart from the light emitting device 22.

The lens 30 may not be formed in the first and second cavities 28 and 29. In this case, the lens 30 is supported by the package body 21 such that the lens 30 can be disposed above the light emitting device 22.

Further, the lens 30 can be formed in the first cavity 28 without being formed in the second cavity 29 such that the lens 30 can be disposed over the light emitting device 22.

In addition, the lens 30 can be formed in the first and second cavities 28 and 29 while making contact with the top surface of the light emitting device 22.

The position of the lens 30 can be variously selected such that the lens 30 can make contact with the light emitting device 22 or can be spaced apart from the light emitting device 22.

The lens 30 is injected into the package body 21 under the semi-cured state or coupled with the package body 21 under the cured state.

The lens 30 has a convex structure and a recess 32, which is concaved downward, is formed at the center of the lens 30.

For instance, the lens 30 exposed out of the package body 21 may have a hemispherical shape and the recess 32 is formed on the lens 30 while overlapping with the light emitting device 22 in the vertical direction.

At least a part of the lens 30 includes a reflective structure 37. For instance, the reflective structure 37 can be formed in the recess 32. The reflective structure 37 has an area corresponding to 5% to 60% based on an area of the upper surface of the lens 30. The recess 32 may be fully or partially filled with the reflective structure 37.

Since the reflective structure 37 is formed in the recess 32, the light emitted from the light emitting device 22, the light reflected from the inner peripheral wall and the bottom surface of the first cavity 28, or the light directed toward the recess 32 after reflected from the inner peripheral wall and the bottom surface of the first cavity 28 can be reflected from the reflective structure 37 so that the light is traveled in the lateral direction of the lens 30.

Therefore, the light emitted from the light emitting device 22, and the light reflected from the inner peripheral walls and the bottom surfaces of the first and second cavities 28 and 29 are emitted to the outside through the outer peripheral portion of the lens 30, that is, the region of the lens 30 where the reflective structure 37 is not formed.

Thus, since the light can be emitted to the outside through the outer peripheral portion of the lens 30, another example of the light emitting apparatus according to the first embodiment can supply light with wide orientation angle.

For instance, the reflective structure 37 can be obtained by mixing organic substance having transmissivity of 70% or more with inorganic substance capable of reflecting or scattering the light. The inorganic substance may include at least one of $TiO_2$, $SiO_2$, Al, $Al_2O_3$, and Ag. The reflective structure 37 can totally or partially reflect the light according to the mixing ratio between the organic substance and the inorganic substance. The mixing ratio between the organic substance and the inorganic substance is in the range of 1:0.001 to 1:1.

In addition, for example, the reflective structure 37 may include a deposition layer formed by using at least one of $SiO_2$, $TiO_2$, Al, Ag, and Ti. The deposition layer may have a thickness of about 100 Å or above.

According to another example of the light emitting apparatus of the first embodiment, the recess 32 is formed on the lens 30 while overlapping with the light emitting device 22 in the vertical direction and the reflective structure 37 is formed in the recess 32, so that the orientation angle of the light emitted from the light emitting device 22 can be adjusted.

According to another example of the light emitting apparatus of the first embodiment, an area of the recess 32 formed on the lens 30 is larger than an area of the recess 32 formed in the light emitting apparatus shown in FIGS. 1 and 2.

The area of the recess 32 shown in FIGS. 1 and 2 is smaller than the area of the second cavity 29. However, the area of the recess 32 shown in FIG. 3 is larger than the area of the second cavity 29. Thus, the area of the reflective structure 37 may be enlarged proportionally to the area of the recess 32.

Since the light emitting apparatus shown in FIG. 3 has the reflective structure 37 larger than that of the light emitting apparatus shown in FIGS. 1 and 2, the orientation angle of the light emitted from the light emitting apparatus can be widened, so that the light emitting apparatus may represent superior light efficiency in the lateral direction.

Figure 4:
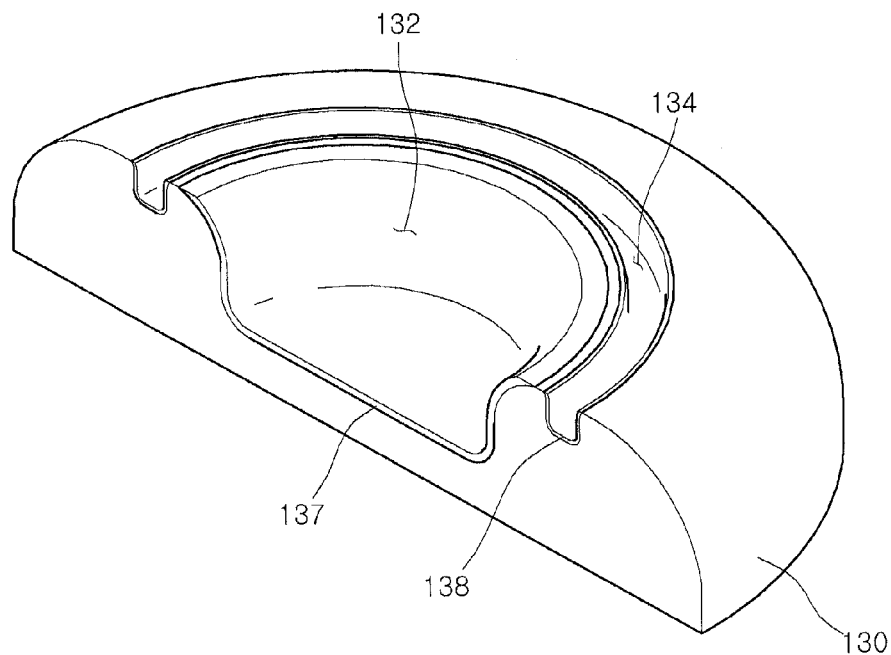
FIG. 4 is a sectional perspective view showing another example of a lens used in a light emitting apparatus according to the first embodiment.

FIG. 4 is a sectional perspective view showing a lens used in another example of the light emitting apparatus according to the first embodiment.

Referring to FIG. 4, a first recess 132, which is concaved downward, is formed on the upper surface of the lens 130, and a first reflective structure 137 is formed in the first recess 132. In addition, a second recess 134, which is concaved downward, is formed around the first recess 132 and a second reflective structure 138 is formed in the second recess 134.

For instance, the second recess 134 is prepared in the form of a ring around the first recess 132. In addition, the first recess 132 may be deeper than the second recess 134.

The first reflective structure 137 is spaced apart from the second reflective structure 138 by a predetermined distance. The light distribution of the light emitting apparatus can be adjusted according to the area of the first reflective structure 137, the area of the second reflective structure 138, and the interval between the first and second reflective structures 137 and 138.

Figure 5:
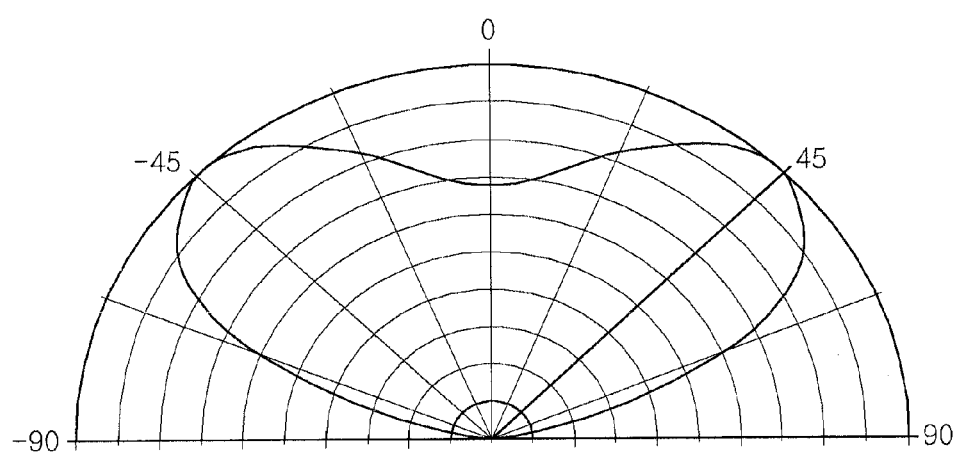
FIG. 5 is a view showing the light distribution of a light emitting apparatus according to the first embodiment shown in FIGS. 1 and 2.
Figure 6:
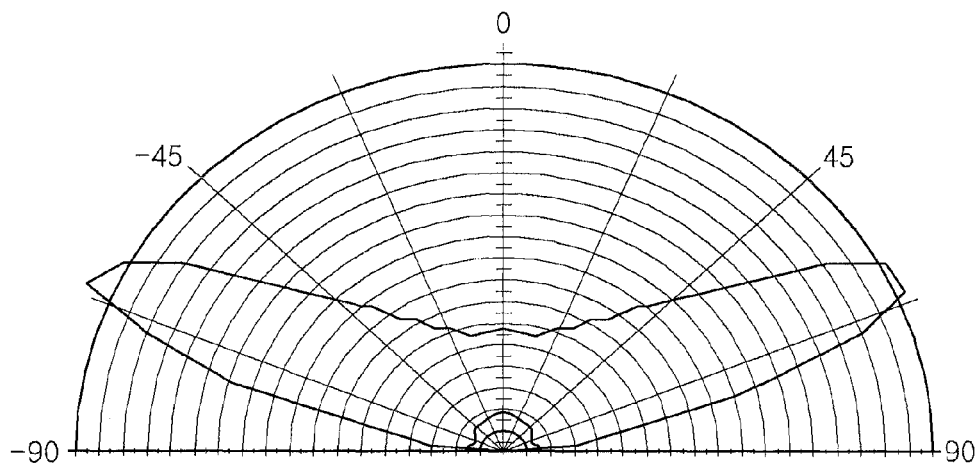
FIG. 6 is a view showing the light distribution of a light emitting apparatus according to another example of the first embodiment shown in FIG. 3.

FIG. 5 is a view showing the light distribution of the light emitting apparatus according to the first embodiment shown in FIGS. 1 and 2, and FIG. 6 is a view showing the light distribution of the light emitting apparatus according to another example of the first embodiment shown in FIG. 3. The light distribution of the light emitting apparatus according to another example of the first embodiment shown in FIG. 4 is similar to that of the light emitting apparatus shown in FIG. 6, so it will be omitted from the drawings in order to avoid redundancy.

As shown in FIG. 5, in the case of the light emitting apparatus according to the first embodiment, the peak-to-peak orientation angle is 90° to 120°. As shown in FIG. 6, in the case of the light emitting apparatus according to another example of the first embodiment, the peak-to-peak orientation angle is 130° to 165°.

That is, the distribution of the light emitted from the light emitting apparatus varies depending on the area of the recess 32 overlapping with the light emitting device 22 in the vertical direction and the reflective structure 37 formed on the recess 32.

FIGS. 7 to 13 are sectional views showing various examples of a light emitting apparatus according to the first embodiment. FIGS. 7 to 13 show light emitting apparatuses having various types of luminescent materials, and the description that has already been described with reference to FIGS. 1 to 6 will be omitted in order to avoid redundancy.

Figure 7:
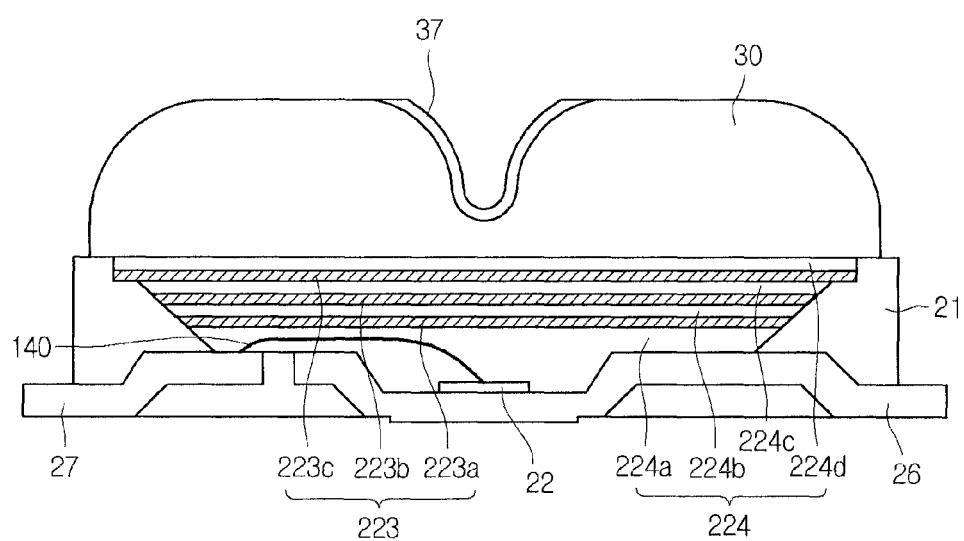
FIGS. 7 to 13 are sectional views showing various examples of a light emitting apparatus according to the first embodiment.

Referring to FIG. 7, the light emitting apparatus includes a first electrode 26, a second electrode 27, a package body 21, a light emitting device 22 and a lens 30.

The light emitting device 22 may be installed on the first electrode 26 or electrically connected to the second electrode 27 through a wire 140.

A luminescent material 223 and an encapsulant 224 may be disposed between the light emitting device 22 and the lens 30.

The luminescent material 223 includes first to third luminescent materials 223a to 223c and the encapsulant 224 includes first to fourth encapsulants 224a to 224d, in which the first encapsulant 224a surrounds the light emitting device 22, the first luminescent material 223a is formed on the first encapsulant 224a, the second encapsulant 224b is formed on the first luminescent material 223a, the second luminescent material 223b is formed on the second encapsulant 224b, the third encapsulant 224c is formed on the second luminescent material 223b, the third luminescent material 223c is formed on the third encapsulant 224c, and the fourth encapsulant 224d is formed on the third luminescent material 223c. The first to third luminescent materials 223a to 223c are spaced apart from the light emitting device 22 while being spaced apart from each other.

For instance, the first to fourth encapsulants 224a to 224d may include epoxy resin or silicone resin.

At least two types of luminescent materials are included in the light emitting apparatus. According to the embodiment, three types of luminescent materials are described as first to third luminescent materials 223a to 223c.

For example, if the light emitting device 22 is a blue light emitting diode chip that emits blue light, the first and second luminescent materials 223a and 223b can be provided in the light emitting apparatus. In this case, the first and second luminescent materials 223a and 223b may serve as a yellow luminescent material that emits yellow light and a green luminescent material that emits green light, respectively, or a yellow luminescent material that emits yellow light and a red luminescent material that emits red light, respectively. In addition, the first and second luminescent materials 223a and 223b may serve as a red luminescent material that emits red light and a green luminescent material that emits green light, respectively.

For example, if the light emitting device 22 is a blue light emitting diode chip that emits blue light, the first to third luminescent materials 223a to 223c can be provided in the light emitting apparatus. In this case, the first to third luminescent materials 223a to 223c may serve as a yellow luminescent material that emits yellow light, a green luminescent material that emits green light, and a red luminescent material that emits red, respectively.

The first to third luminescent materials 223a to 223c may be disposed on the optical path of the light emitted from the light emitting device 22. The luminescent material closer to the light emitting device 22 may emit light having a shorter wavelength. For instance, if the light emitting device 22 is a blue light emitting diode chip, the first luminescent material 223a includes a green luminescent material, the second luminescent material 223b includes a yellow luminescent material, and the third luminescent material 223c includes a red luminescent material. In addition, for example, if the light emitting device 22 is a UV light emitting diode chip, the first luminescent material 223a includes a blue luminescent material, the second luminescent material 223b includes a green luminescent material, and the third luminescent material 223c includes a red luminescent material.

The green luminescent material may include an oxynitride-based luminescent material or a silicate-based luminescent material, the yellow luminescent material may include a YAG luminescent material, a TAG luminescent material or silicate-based luminescent material, and the red luminescent material may include an oxynitride-based luminescent material or a nitride-based luminescent material.

If the first to third luminescent materials serve as green, yellow and red luminescent materials, respectively, the amount of the yellow luminescent material is greatest, and the amount of the red luminescent material is smallest.

The green luminescent material may include a luminescent material that emits the light having the FWHM (full width at half-maximum) of 50 to 100 nm, preferably, 60 to 90 nm. For instance, the green luminescent material is a silicate-based luminescent material that emits the light having the FWHM of 60 to 100 nm and includes $(Sr,Ba,Mg,Ca)_2SiO_4:EU^{2+}$, or an oxynitride-based luminescent material that emits the light having the FWHM of 50 to 70 nm and includes $Si_{6-x}Al_xO_xN_{8-x}:EU^{2+}$ (0<X<6). In the case of the silicate-based luminescent material, if the molar ratio of Ba is equal to or greater than that of Sr, the silicate-based luminescent material may emit the light having the wavelength band of green light. In addition, if the molar ratio of Sr is greater than that of Ba, the silicate-based luminescent material may emit the light having the wavelength band of yellow light. In addition, at least one of Mg and Ca can be selectively employed.

The yellow luminescent material emits the light having the FWHM of 50 to 100 nm or 120 nm or above. For instance, the yellow luminescent material is a YAG luminescent material including $Y_3Al_5O_{12}:Ce^{3+}$, a TAG luminescent material including $Tb_3Al_5O_{12}:Ce^{3+}$, or a silicate-based luminescent material that emits the light having the FWHM of 60 to 100 nm and includes $(Sr, Ba, Mg, Ca)_2SiO_4:EU^{2+}$.

The red luminescent material may include a nitride-based luminescent material that emits the light having the FWHM of 80 to 110 nm, preferably, 90 to 100 nm. For instance, the red luminescent material may include a luminescent material that emits the light having the FWHM of 90 to 100 nm and includes $CaAlSiN_3:EU^{2+}$.

For example, the first luminescent material 223a may include the oxynitride-based luminescent material, the second luminescent material 223b may include the YAG luminescent material, and the third luminescent material 223c may include the nitride-based luminescent material.

In addition, for instance, the first luminescent material 223a may include the silicate-based luminescent material, the second luminescent material 223b may include the silicate-based luminescent material, and the third luminescent material 223c may include the nitride-based or oxynitride-based luminescent material.

Further, for instance, the first luminescent material 223a may include the silicate-based luminescent material, the second luminescent material 223b may include the YAG luminescent material, and the third luminescent material 223c may include the oxynitride-based luminescent material.

In addition, for instance, the first luminescent material 223a may include the YAG luminescent material or the silicate-based luminescent material, the second luminescent material 223b may include the oxynitride-based luminescent material, and the third luminescent material 223c may include the oxynitride-based luminescent material.

Further, for instance, the first luminescent material 223a may include the oxynitride-based luminescent material, the second luminescent material 223b may include the oxynitride-based luminescent material, and the third luminescent material 223c may include the oxynitride-based luminescent material. Therefore, the light emitting apparatus shown in FIG. 7 can emit the white light by using at least two types of luminescent materials.

Figure 8:
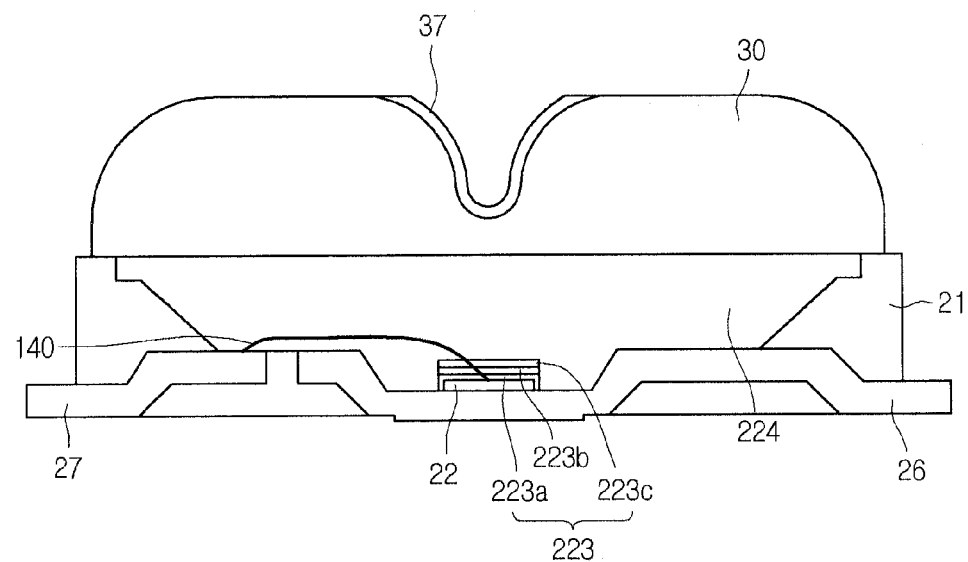

Referring to FIG. 8, the light emitting apparatus includes a first electrode 26, a second electrode 27, a package body 21, a light emitting device 22 and a lens 30.

The light emitting device 22 may be installed on the first electrode 26 or electrically connected to the second electrode 27 through a wire 140.

A luminescent material 223 and an encapsulant 224 may be disposed between the light emitting device 22 and the lens 30.

The luminescent material 223 includes a first luminescent material 223a, which is disposed around the top surface and lateral sides of the light emitting device 22 to surround the light emitting device 22, a second luminescent material 223b, which is disposed on the first luminescent material 223a around the top surface and lateral sides of the light emitting device 22 to surround the light emitting device 22, and a third luminescent material 223c, which is disposed on the second luminescent material 223b around the top surface and lateral sides of the light emitting device 22 to surround the light emitting device 22. The encapsulant 224 surrounds the first to third luminescent materials 223a to 223c.

For instance, the first luminescent material 223a can make contact with the light emitting device 22, the second luminescent material 223b can make contact with the first luminescent material 223a while being spaced apart from the light emitting device 22, and the third luminescent material 223c can make contact with the second luminescent material 223b while being spaced apart from the light emitting device 22.

The encapsulant 224 may include epoxy resin or silicone resin, and the first to third luminescent materials 223a to 223c are identical to those shown in FIG. 7.

Figure 9:
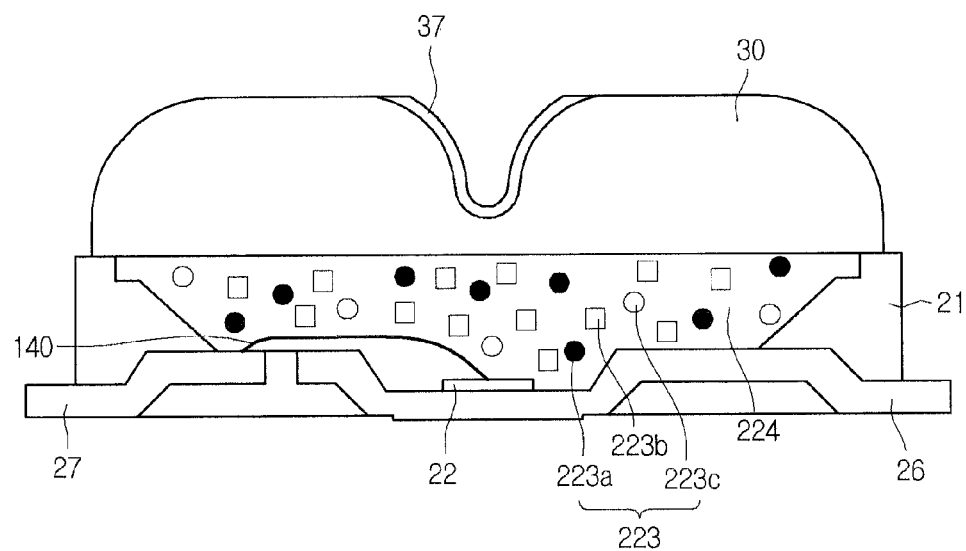

Referring to FIG. 9, the light emitting apparatus includes a first electrode 26, a second electrode 27, a package body 21, a light emitting device 22 and a lens 30.

The light emitting device 22 may be installed on the first electrode 26 or electrically connected to the second electrode 27 through a wire 140.

A luminescent material 223 and an encapsulant 224 may be disposed between the light emitting device 22 and the lens 30.

The luminescent material 223 includes first to third luminescent materials 223a to 223c distributed in the encapsulant 224.

The encapsulant 224 may include epoxy resin or silicone resin, and the first to third luminescent materials 223a to 223c are identical to those shown in FIG. 7.

Figure 10:
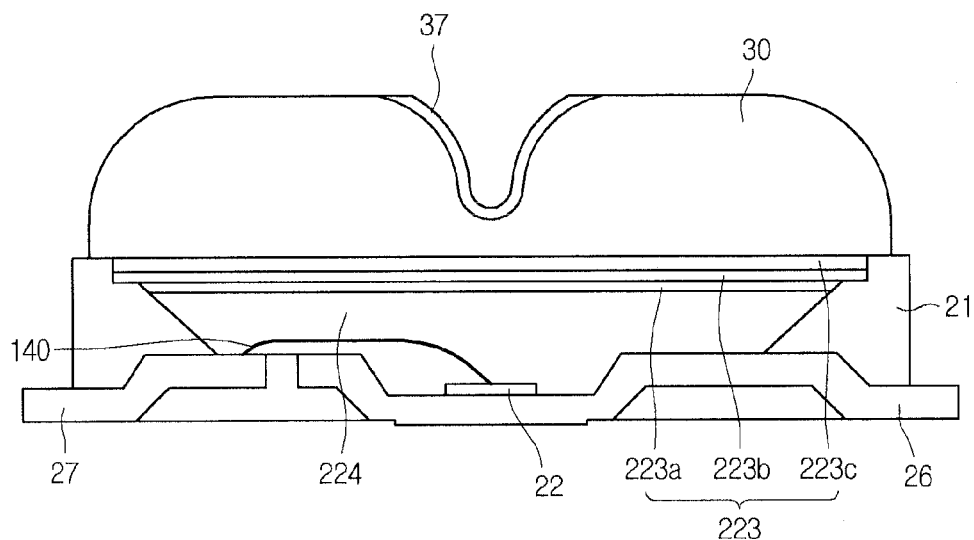

Referring to FIG. 10, the light emitting apparatus includes a first electrode 26, a second electrode 27, a package body 21, a light emitting device 22 and a lens 30.

The light emitting device 22 may be installed on the first electrode 26 or electrically connected to the second electrode 27 through a wire 140.

A luminescent material 223 and an encapsulant 224 may be disposed between the light emitting device 22 and the lens 30.

The encapsulant 224 surrounds the light emitting device 22, and the luminescent material 223 includes a first luminescent material 223a formed on the encapsulant 224, a second luminescent material 223b formed on the first luminescent material 223a, and a third luminescent material 223c formed on the second luminescent material 223b.

For instance, the first luminescent material 223a is formed on the encapsulant 224 while being spaced apart from the light emitting device 22, the second luminescent material 223b makes contact with the first luminescent material 223a, and the third luminescent material 223c makes contact with the second luminescent material 223b.

The encapsulant 224 may include epoxy resin or silicone resin, and the first to third luminescent materials 223a to 223c are identical to those shown in FIG. 7.

Figure 11:
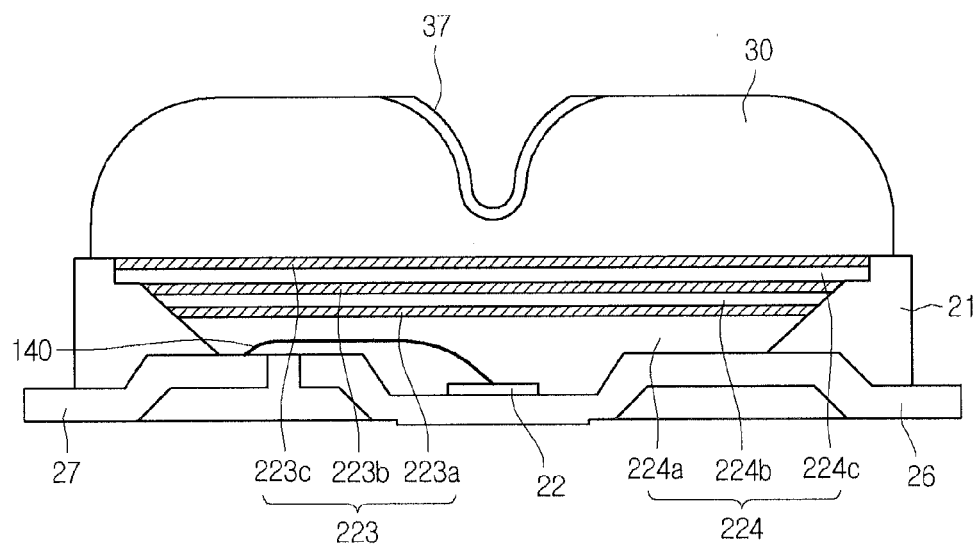

Referring to FIG. 11, the light emitting apparatus includes a first electrode 26, a second electrode 27, a package body 21, a light emitting device 22 and a lens 30.

The light emitting device 22 may be installed on the first electrode 26 or electrically connected to the second electrode 27 through a wire 140.

A luminescent material 223 and an encapsulant 224 may be disposed between the light emitting device 22 and the lens 30.

The luminescent material 223 includes first to third luminescent materials 223a to 223c and the encapsulant 224 includes first to third encapsulants 224a to 224c, in which the first encapsulant 224a surrounds the light emitting device 22, the first luminescent material 223a is formed on the first encapsulant 224a, the second encapsulant 224b is formed on the first luminescent material 223a, the second luminescent material 223b is formed on the second encapsulant 224b, the third encapsulant 224c is formed on the second luminescent material 223b, and the third luminescent material 223c is formed on the third encapsulant 224c.

For instance, the first luminescent material 223a is spaced apart from the light emitting device 22, the second luminescent material 223b is spaced apart from the first luminescent material 223a, and the third luminescent material 223c is spaced apart from the second luminescent material 223b.

The first to third encapsulants 224a to 224c may include epoxy resin or silicone resin, and the first to third luminescent materials 223a to 223c are identical to those shown in FIG. 7.

Figure 12:
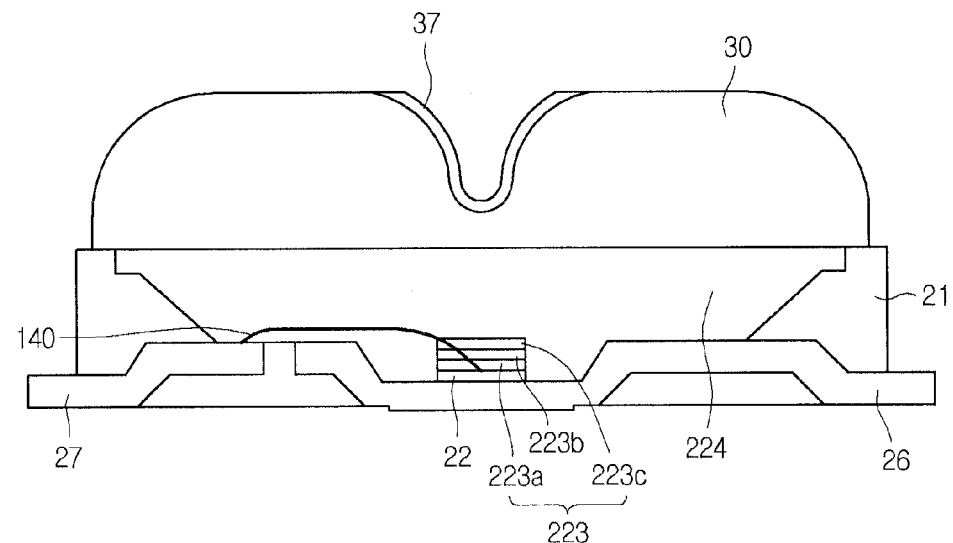

Referring to FIG. 12, the light emitting apparatus includes a first electrode 26, a second electrode 27, a package body 21, a light emitting device 22 and a lens 30.

The light emitting device 22 may be installed on the first electrode 26 or electrically connected to the second electrode 27 through a wire 140.

A luminescent material 223 and an encapsulant 224 may be disposed between the light emitting device 22 and the lens 30.

The luminescent material 223 includes a first luminescent material 223a, which is disposed around the top surface of the light emitting device 22, a second luminescent material 223b, which is disposed on the first luminescent material 223a around the top surface of the light emitting device 22, and a third luminescent material 223c, which is disposed on the second luminescent material 223b around the top surface of the light emitting device 22. The encapsulant 224 surrounds the first to third luminescent materials 223a to 223c.

For instance, the first luminescent material 223a can make contact with the light emitting device 22, the second luminescent material 223b can make contact with the first luminescent material 223a while being spaced apart from the light emitting device 22, and the third luminescent material 223c can make contact with the second luminescent material 223b.

The encapsulant 224 may include epoxy resin or silicone resin, and the first to third luminescent materials 223a to 223c are identical to those shown in FIG. 7.

Figure 13:
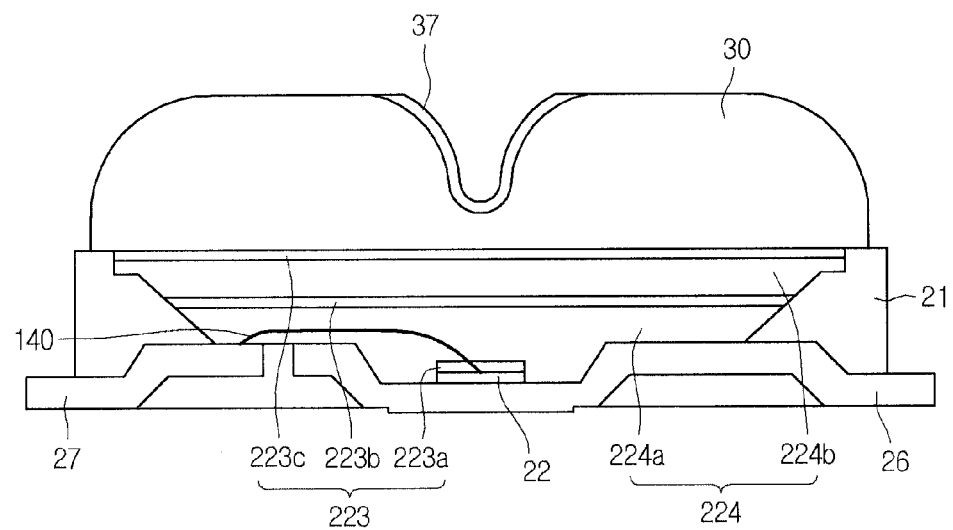

Referring to FIG. 13, the light emitting apparatus includes a first electrode 26, a second electrode 27, a package body 21, a light emitting device 22 and a lens 30.

The light emitting device 22 may be installed on the first electrode 26 or electrically connected to the second electrode 27 through a wire 140.

A luminescent material 223 and an encapsulant 224 may be disposed between the light emitting device 22 and the lens 30.

The luminescent material 223 includes first to third luminescent materials 223a to 223c, and the encapsulant 224 includes first and second encapsulants 224a and 224b, in which the first luminescent material 223a is disposed around the top surface of the light emitting device 22, the first encapsulant 224a surrounds the light emitting device 22 and the first luminescent material 223a, the second luminescent material 223b is disposed on the first encapsulant 224a, the second encapsulant 224b is disposed on the second luminescent material 223b, and the third luminescent material 223c is disposed on the second encapsulant 224b.

For instance, the first luminescent material 223a can make contact with the light emitting device 22, the second luminescent material 223b can be formed on the first encapsulant 224a while being spaced apart from the first luminescent material 223a, and the third luminescent material 223c can be formed on the second encapsulant 224b while being spaced apart from the second luminescent material 223b.

The first and second encapsulants 224a and 224b may include epoxy resin or silicone resin, and the first to third luminescent materials 223a to 223c are identical to those shown in FIG. 7.

Figure 14:
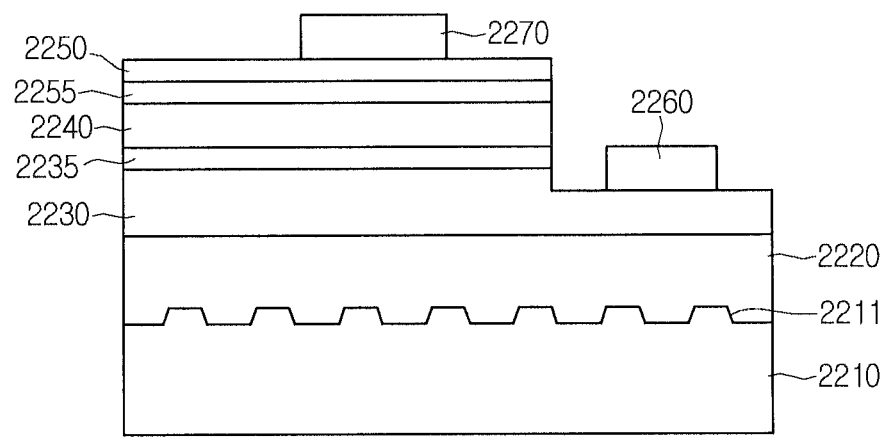
FIG. 14 is a sectional view showing a light emitting device used in a light emitting apparatus according to the first embodiment.

FIG. 14 is a sectional view showing the light emitting device used in the light emitting apparatus according to the first embodiment.

The light emitting device 22 according to the embodiment includes a growth substrate 2210, an undoped semiconductor layer 2220 formed on the growth substrate 2210, and a light emitting structure layer formed on the undoped semiconductor layer 2220. The light emitting structure layer includes a first conductive semiconductor layer 2230, an active layer 2240, and a second conductive semiconductor layer 2250 formed on the undoped semiconductor layer 2220. A first electrode layer 2260 is formed on the first conductive semiconductor layer 2230 and a second electrode layer 2270 is formed on the second conductive semiconductor layer 2250.

A first conductive InGaN/GaN superlattice structure or a first conductive InGaN/InGaN superlattice structure 2235 may be formed between the first conductive semiconductor layer 2230 and the active layer 2240.

In addition, a second conductive AlGaN layer 2255 can be formed between the second conductive semiconductor layer 2250 and the active layer 2240.

The growth substrate 2210 may include at least one selected from the group consisting of $Al_2O_3$, SiC, Si, GaAs, GaN, ZnO, Si, GaP, InP, and Ge, and the embodiment is not limited thereto. For instance, the light emitting structure layer can be grown on the growth substrate 2210 including $Al_2O_3$.

A plurality of protrusion patterns 2211 can be formed on the growth substrate 2210. The protrusion patterns 2211 scatter the light emitted from the active layer 2240, thereby improving light efficiency.

For instance, the protrusion patterns 2211 may have one of hemispherical shapes, polygonal shapes, triangular conical shapes, and nano pillar shapes.

The undoped semiconductor layer 2220 is a nitride layer having a first conductive conduction property although first conductive impurities are not intentionally injected into the undoped semiconductor layer 2220. For example, the undoped semiconductor layer 2220 may include an undoped-GaN layer. A buffer layer may be formed between the undoped semiconductor layer 2220 and the growth substrate 2210. In addition, the undoped semiconductor layer 2220 is not necessarily required. That is, the undoped semiconductor layer 2220 may be omitted.

For instance, the first conductive semiconductor layer 2230 may include an n type semiconductor layer. The first conductive semiconductor layer 2230 may include semiconductor materials having the compositional formula of $In_xAl_yGa_{1-x-y}N$ ($0 \le x \le 1$, $0 \le y \le 1$, $0 \le x+y \le 1$). For instance, the first conductive semiconductor layer 2230 may include one selected from the group consisting of InAlGaN, GaN, AlInN, InGaN, AlN, and InN and may be doped with n type dopant, such as Si, Ge or Sn.

Electrons (or holes) injected through the first conductive semiconductor layer 2230 is recombined with holes (or electrons) injected through the second semiconductor layer 2250 at the active layer 2240, so that the active layer 2240 emits the light having the wavelength determined according to energy band of intrinsic material of the active layer 2240.

The active layer 2240 may have the single quantum well structure, the MQW (multiple quantum well) structure, the quantum dot structure or the quantum line structure, but the embodiment is not limited thereto.

The active layer 2240 may include semiconductor materials having the compositional formula of $In_xAl_yGa_{1-x-y}N$ ($0 \le x \le 1$, $0 \le y \le 1$, $0 \le x+y \le 1$). If the active layer 2240 has the MQW structure, the active layer 2240 may include a plurality of well layers and barrier layers. For instance, the active layer 2240 may have a stack structure of InGaN well/GaN barrier layers.

A clad layer (not shown) doped with the n type or p type dopant can be formed on and/or under the active layer 2240. The clad layer may include an AlGaN layer or an InAlGaN layer.

For instance, the second conductive semiconductor layer 2250 may include a p type semiconductor layer. The second conductive semiconductor layer 2250 may include semiconductor materials having the compositional formula of $In_xAl_yGa_{1-x-y}N$ ($0 \le x \le 1$, $0 \le y \le 1$, $0 \le x+y \le 1$), such as InAlGaN, GaN, AlGaN, InGaN, AlInN, AlN, or InN. In addition, the second conductive semiconductor layer 2250 may be doped with p type dopant such as Mg, Zn, Ca, Sr, or Ba.

The first conductive semiconductor layer 2230 may include a p type semiconductor layer and the second conductive semiconductor layer 2250 may include an n type semiconductor layer. In addition, a third conductive semiconductor layer (not shown) including an n type or a p type semiconductor layer can be formed on the second conductive semiconductor layer 2250. Thus, the light emitting structure layer may have one of NP, PN, NPN and PNP junction structures. In addition, the impurities can be uniformly or non-uniformly doped in the first and second conductive semiconductor layers 2230 and 2250. That is, the light emitting structure layer may have various structures without limitations.

The first electrode layer 2260 is formed on the first conductive semiconductor layer 2230, and the second electrode layer 2270 is formed on the second conductive semiconductor layer 2250 to supply power to the active layer 2240.

The light emitting device 22 may include a GaN-based light emitting diode, which generates the blue light having the center wavelength at the wavelength band of 450 nm to 480 nm, preferably, 465 nm, and the FWHM of 15 nm to 40 nm.

Figure 15:
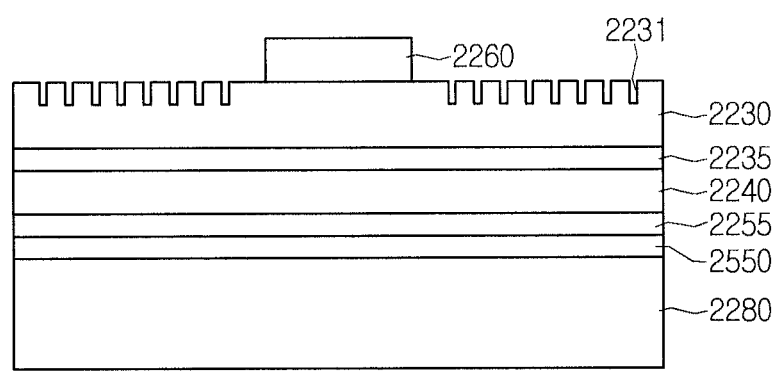
FIG. 15 is a sectional view showing another example of a light emitting device used in a light emitting apparatus according to the first embodiment.

FIG. 15 is a sectional view showing another example of the light emitting device used in the light emitting apparatus according to the first embodiment. In the following description, the elements and structures that have already been described with reference to FIG. 14 will not be further described in order to avoid redundancy.

The light emitting device 22 includes a conductive support substrate 2280, a light emitting structure layer formed on the conductive support substrate 2280 and including a first conductive semiconductor layer 2230, an active layer 2240, and a second conductive semiconductor layer 2250, and a first electrode layer 2260 formed on the first conductive semiconductor layer 2230.

A first conductive InGaN/GaN superlattice structure or a first conductive InGaN/InGaN superlattice structure 2235 may be formed between the first conductive semiconductor layer 2230 and the active layer 2240.

In addition, a second conductive AlGaN layer 2255 can be formed between the second conductive semiconductor layer 2250 and the active layer 2240.

A light extracting structure 2231 having the column shape or the hole shape can be formed on the first conductive semiconductor layer 2230. The light extracting structure 2231 allows the light generated from the active layer 2240 to be effectively emitted to the outside.

For instance, the light extracting structure 2231 may have one of hemispherical shapes, polygonal shapes, triangular conical shapes, and nano pillar shapes. In addition, the light extracting structure 2231 may include photonic crystal.

The conductive support substrate 2280 supports the light emitting structure layer and supplies power to the light emitting structure layer in cooperation with the first electrode layer 2260.

The conductive support substrate 2280 may includes a support layer, an ohmic contact layer, and a bonding layer between the support layer and the ohmic contact layer. The support layer may include at least one selected from the group consisting of Cu, Ni, Mo, Al, Au, Nb, W, Ti, Cr, Ta, Pd, Pt, Si, Ge, GaAs, ZnO, and SiC. In addition, the ohmic contact layer is formed by using a metal including Ag or Al to make an ohmic contact with respect to the second conductive semiconductor layer 2250 while serving as a reflective structure. The ohmic contact layer may include a first layer having the ohmic contact function and a second layer having the reflective function. For instance, the first layer having the ohmic contact function may include a material making ohmic-contact with the second conductive semiconductor layer 2250. For instance, the first layer having the ohmic contact function can be prepared as a single layer or a multiple layer by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x/ITO$, Ni, Ag, $Ni/IrO_x/Au$, and $Ni/IrO_x/Au/ITO$.

The bonding layer may include at least one or at least two selected from the group consisting of Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—$Cu_2$O, Cu—Zn, Cu—P, Ni—P, Ni—Mn—Pd, Ni—P, and Pd—Ni.

The light emitting structure layer may include a compound semiconductor layer including a plurality of group III-V elements. An insulating layer can be formed on the top surface and lateral sides of the light emitting structure.

For instance, the first conductive semiconductor layer 2230 may include an n type semiconductor layer. The first conductive semiconductor layer 2230 may include semiconductor materials having the compositional formula of $In_xAl_yGa_{1-x-y}N$ ($0\le x\le 1$, $0\le y\le 1$, $0\le x+y\le 1$). For instance, the first conductive semiconductor layer 2230 may include one selected from the group consisting of InAlGaN, GaN, AlInN, InGaN, AlN, and InN and may be doped with n type dopant, such as Si, Ge or Sn.

Electrons (or holes) injected through the first conductive semiconductor layer 2230 is recombined with holes (or electrons) injected through the second semiconductor layer 2250 at the active layer 2240, so that the active layer 2240 emits the light having the wavelength determined according to energy band of intrinsic material of the active layer 2240.

The active layer 2240 may have the single quantum well structure, the MQW (multiple quantum well) structure, the quantum dot structure or the quantum line structure, but the embodiment is not limited thereto.

The active layer 2240 may include semiconductor materials having the compositional formula of $In_xAl_yGa_{1-x-y}N$ ($0\le x\le 1$, $0\le y\le 1$, $0\le x+y\le 1$). If the active layer 2240 has the MQW structure, the active layer 2240 may include a plurality of well layers and barrier layers. For instance, the active layer 2240 may have a stack structure of InGaN well/GaN barrier layers.

A clad layer (not shown) doped with the n type or p type dopant can be formed on and/or under the active layer 2240. The clad layer may include an AlGaN layer or an InAlGaN layer.

For instance, the second conductive semiconductor layer 2250 may include a p type semiconductor layer. The second conductive semiconductor layer 2250 may include semiconductor materials having the compositional formula of $In_xAl_yGa_{1-x-y}N$ ($0\le x\le 1$, $0\le y\le 1$, $0\le x+y\le 1$), such as InAlGaN, GaN, AlGaN, InGaN, AlInN, AlN, or InN. In addition, the second conductive semiconductor layer 2250 may be doped with p type dopant such as Mg, Zn, Ca, Sr, or Ba.

Meanwhile, the first conductive semiconductor layer 2230 may include a p type semiconductor layer and the second conductive semiconductor layer 2250 may include an n type semiconductor layer. In addition, a third conductive semiconductor layer (not shown) including an n type or a p type semiconductor layer can be formed on the second conductive semiconductor layer 2250. Thus, the light emitting structure layer may have one of NP, PN, NPN and PNP junction structures. In addition, the impurities can be uniformly or non-uniformly doped in the first and second conductive semiconductor layers 2230 and 2250. That is, the light emitting structure layer may have various structures without limitations.

A current blocking area (not shown) can be formed between the second conductive semiconductor layer 2250 and the conductive support substrate 2280 such that at least apart of the current blocking area can overlap with the first electrode layer 2260. The current blocking area may include a material having electric conductivity lower than that of the conductive support substrate 2280, or an electric insulating material. In addition, the current blocking area can be formed by applying plasma damage to the second conductive semiconductor layer 2250. Due to the current blocking area, the current can be widely spread, so that light efficiency of the active layer 2240 can be improved.

The light emitting device 22 may include a GaN-based light emitting diode, which generates the blue light having the center wavelength at the wavelength band of 450 nm to 480 nm, preferably, 465 nm, and the FWHM of 15 nm to 40 nm.

Second Embodiment

Figure 16:
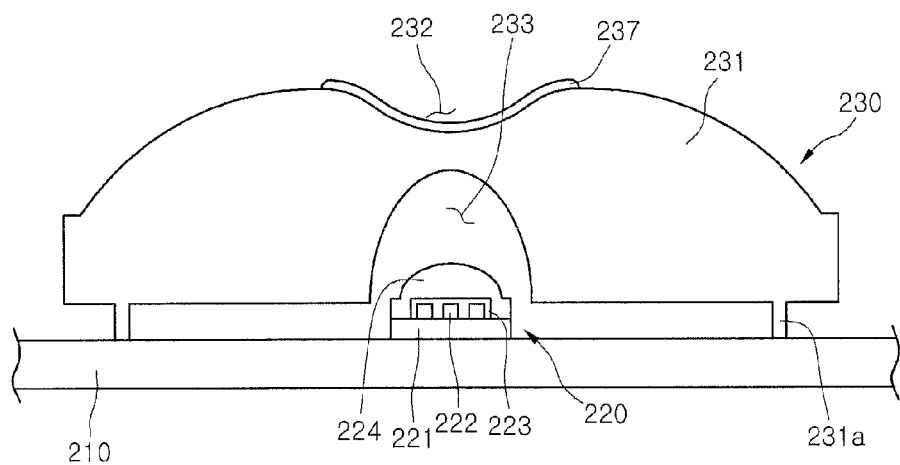
FIGS. 16 and 17 are views showing a light emitting apparatus according to the second embodiment.
Figure 17:
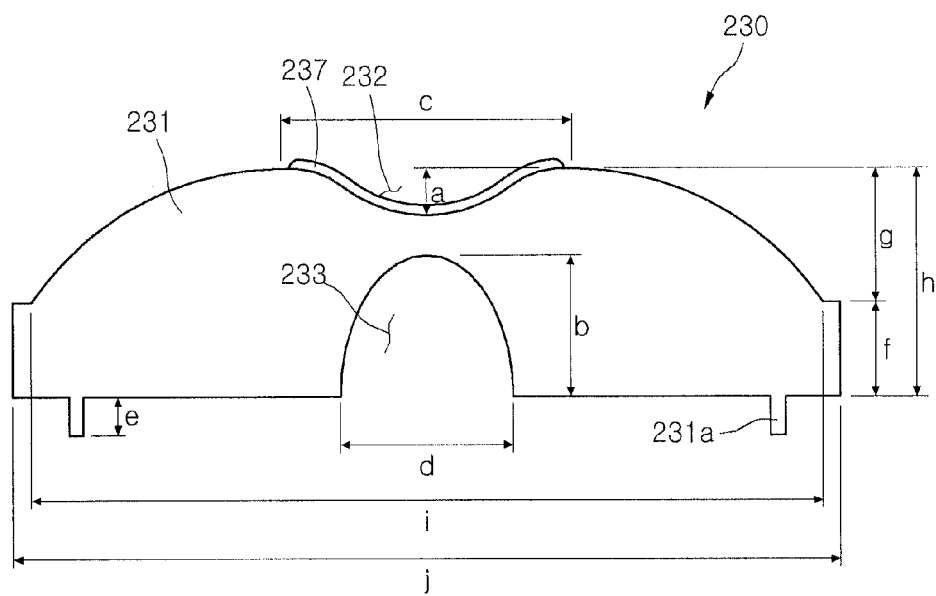

FIGS. 16 and 17 are views showing a light emitting apparatus according to the second embodiment.

In the following description, the elements and structures that have already been described with reference to the first embodiment will not be further described in order to avoid redundancy.

Referring to FIGS. 16 and 17, the light emitting apparatus according to the second embodiment includes a substrate 210, a light emitting device package 220 installed on the substrate 210, and a lens 230 installed over the light emitting device package 220 while being supported by the substrate 210.

The substrate 210 may include PCB (printed circuit board) and a circuit pattern (not shown) is formed on the substrate 210. The circuit pattern is electrically connected to the light emitting device package 220.

In addition, the substrate 210 may include MCPCB (metal core printed circuit board). The material and the structure of the substrate 210 can be variously selected.

The light emitting device package 220 includes a package body 221, at least one light emitting device 222 installed on the package body 221, a luminescent material 223 surrounding the light emitting device 222, and an encapsulant 224 surrounding the luminescent material 223 on the package body 221.

The package body 221 is provided therein with electrodes (not shown). The electrodes are formed through the package body 221 or on the surface of the package body 221 to electrically connect the light emitting device 222 with the circuit pattern of the substrate 210. The package body 221 can be formed by using various materials. For instance, the package body 221 can be formed by using one of a ceramic material, a resin material and a silicone material.

The light emitting device 222 can be prepared in the form of a light emitting diode chip. A plurality of light emitting devices 222 can be installed on the package body 221. According to the embodiment, three light emitting devices 222 are installed on the package body 221.

The light emitting devices 222 are connected with each other in parallel or series. In addition, the light emitting devices 222 are can be electrically connected with the electrodes through the flip chip scheme or the wire bonding scheme.

For instance, the light emitting device 222 is a light emitting diode chip including an n type semiconductor layer, an active layer and a p type semiconductor layer.

The light emitting device 222 may include a colored light emitting diode chip, such as a blue light emitting diode chip, a red light emitting diode chip, or a green light emitting diode chip. In addition, the light emitting device 222 may include a UV (ultraviolet) light emitting diode chip that emits UV light. The type of the chip can be variously selected. According to the embodiment, the blue light emitting diode chip that emits the blue light is employed as the light emitting device 222.

The luminescent material 223 surrounds the light emitting device 222 on the package body 221. For instance, the luminescent material 223 may include a yellow luminescent material. The type of the luminescent materials included in the luminescent material 223 can be variously selected. The top surface of the luminescent material 223 is planarized such that the luminescent material 223 has a predetermined height on the package body 221.

The encapsulant 224 is formed on the package body 221 and surrounds the luminescent material 223. The encapsulant 224 may include a transparent resin material, such as epoxy resin or silicone resin.

The center of the upper surface of the encapsulant 224 is convex and the peripheral portion around the center of the upper surface of the encapsulant 224 is planarized.

The lens 230 includes a lens body 231 and a lens supporter 231a to support the lens body 231. The lens body 231 and the lens supporter 231a are integrally formed with each other through injection molding, or separately formed from each other and then bonded with each other by using an adhesive.

When viewed in the plan view, the lens body 231 has a substantially circular shape. In addition, a concave-convex section or roughness can be formed on the bottom surface of the lens body 231.

A plurality of lens supporters 231a can be provided on the bottom surface of the lens body 231. Although only two lens supporters 231a are shown in FIGS. 16 and 17, at least three lens supporters 231a can be provided while being spaced apart from each other to stably support the lens body 231. The number and shape of the lens supporter 231a may be changed according to the design of the light emitting apparatus.

The lens body 231 includes a transparent resin material and is spaced apart from the substrate 210 by the lens supporter 231a. The lens supporters 231a can be securely attached to the substrate 210 by using an adhesive.

The upper surface of the lens body 231 is generally convex and a first recess 232, which is concaved downward, is formed at the center of the upper surface of the lens body 231. A reflective structure 237 can be formed in the first recess 232. The first recess 232 may be fully or partially filled with the reflective structure 237.

For instance, the reflective structure 237 can be obtained by mixing organic substance having transmissivity of 70% or more with inorganic substance capable of reflecting or scattering the light. The inorganic substance may include at least one of $TiO_2$, $SiO_2$, Al, $Al_2O_3$, and Ag. The reflective structure 237 can totally or partially reflect the light according to the mixing ratio between the organic substance and the inorganic substance. The mixing ratio between the organic substance and the inorganic substance is in the range of 1:0.001 to 1:1.

In addition, for example, the reflective structure 237 may include a deposition layer formed by using at least one of $SiO_2$, $TiO_2$, Al, Ag, and Ti. The deposition layer may have a thickness of about 100 Å or above.

In addition, the lens body 231 has a planar bottom surface and a second recess 233, which is concaved upward, is formed at the center of the bottom surface of the lens body 231. The first recess 232 overlaps with the second recess 233 in the vertical direction.

Since the first and second recesses 232 and 233 are positioned at the center of the lens body 231, the center portion of the lens body 231 has a thin thickness. In detail, the thickness of the lens body 231 is gradually increased from the center to the peripheral portion of the lens body 231 and then decreased again at the outer peripheral portion of the lens body 231.

In addition, the outer peripheral portion of the upper surface of the lens body 231 may be planarized and the lateral sides of the lens body 231 may be perpendicular to the bottom surface of the lens body 231.

The maximum depth (a) of the first recess 232 is in the range of 0.3 to 0.4 mm, and the maximum depth (b) of the second recess 233 is in the range of 2.5 to 3 mm. In addition, the maximum width (c) of the first recess 232 is in the range of 3.5 to 4 mm, and the maximum width (d) of the second recess 233 is in the range of 2.5 to 3 mm.

The maximum thickness (e) of the lens supporter 231a is in the range of 0.5 to 0.8 mm.

The maximum thickness (h) of the lens body 231 is in the range of 4 to 5 mm, the maximum thickness (f) from the bottom surface to the planar part of the upper surface of the lens body 231 is in the range of 1.8 to 2.2 mm, and the maximum thickness (g) from the planar part of the upper surface to the uppermost part of the lens body 231 is in the range of 2.2 to 2.8 mm.

The maximum width (j) of the lens body 231 is in the range of 13 to 19 mm, and the maximum width (i) of the curvature part of the lens body 231 is in the range of 12 to 18 mm.

Meanwhile, the maximum thickness from the light emitting device package 220 to the package body 221 is in the range of 0.3 to 0.4 mm, and the height from the upper surface of the package body 231 to the uppermost surface of the encapsulant 224 is in the range of 1.1 to 1.5 mm.

According to the second embodiment, a ratio of the maximum depth (a) of the first recess 232 to the maximum thickness (h) of the lens body 231 is in the range of 0.06 to 0.1, and a ratio of the maximum depth (b) of the second recess 233 to the maximum thickness (h) of the lens body 231 is in the range of 0.5 to 0.75. In addition, a ratio of the maximum depth (b) of the second recess 233 to the maximum depth (a) of the first recess 232 is in the range of 6.25 to 10.

Further, a ratio of the maximum width (c) of the first recess 232 to the maximum width (j) of the lens body 231 is in the range of 0.18 to 0.3, a ratio of the maximum width (d) of the second recess 233 to the maximum width (j) of the lens body 231 is in the range of 0.14 to 0.25, and a ratio of the maximum width (d) of the second recess 233 to the maximum width (c) of the first recess 232 is in the range of 0.7 to 0.94.

In addition, at least a part of the encapsulant 224 is provided in the second recess 233. The maximum thickness of the package body 221 is less than the maximum thickness of the lens supporter 231a, and the bottom surface of the lens body 231 is disposed on the same plane with the light emitting device 222, the luminescent material 224 or the encapsulant 224.

Therefore, the light emitting apparatus having the above structure may represent superior light efficiency in the lateral direction. The light generated from the light emitting device 222 is reflected and refracted from the encapsulant 224 and the second recess 233, and then reflected from the reflective structure 237, so that a greater amount of light can be emitted in the lateral direction. In particular, the reflective structure 237 formed in the first recess 232 and the second recess 233 may reduce the amount of light emitted in the upward direction.

Figure 18:
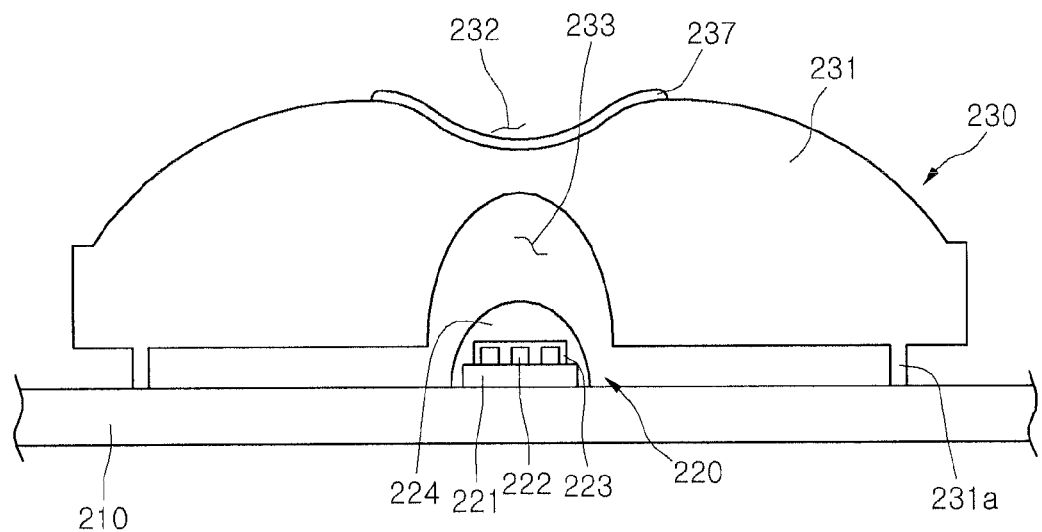
FIG. 18 is a view showing another example of a light emitting apparatus according to the second embodiment.

FIG. 18 is a view showing another example of a light emitting apparatus according to the second embodiment.

In the following description, the elements and structures that have already been described with reference to FIGS. 16 and 17 will not be further described in order to avoid redundancy.

Referring to FIG. 18, according to another example of the light emitting apparatus of the second embodiment, the light emitting device package 220 includes the encapsulant 224 adjacent to the substrate 210. The encapsulant 224 is formed on the substrate 210, the package body 221 and the luminescent material 223.

Since the encapsulant 224 makes contact with the lateral sides of the substrate 210 and the package body 221, the contact area is enlarged, so that the encapsulant 224 can be more securely coupled to the substrate 210 and the package body 221.

Figure 19:
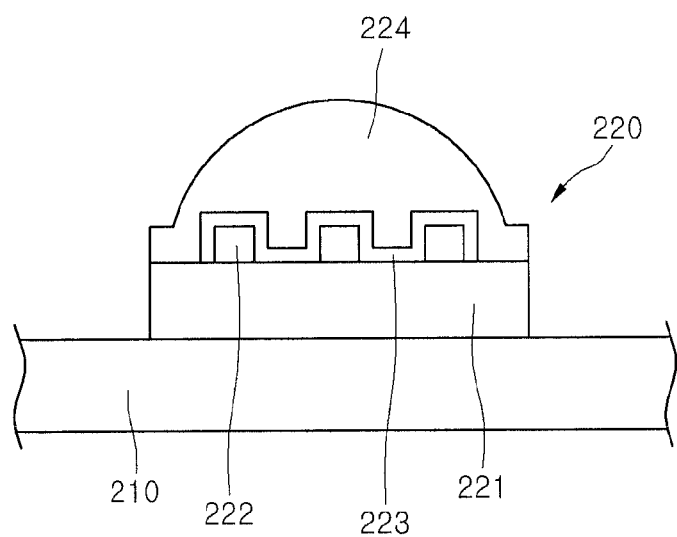
FIG. 19 is a view showing still another example of a light emitting apparatus according to the second embodiment.

FIG. 19 is a view showing another example of a light emitting apparatus according to the second embodiment. In FIG. 19, a lens is omitted.

In the following description, the elements and structures that have already been described with reference to FIGS. 16 and 17 will not be further described in order to avoid redundancy.

Referring to FIG. 19, according to another example of the light emitting apparatus of the second embodiment, the light emitting device package 220 includes a package body 221 and a luminescent material 223 formed on a light emitting device 222 with a predetermined thickness.

The luminescent material 223 is disposed in a corrugate shape along the contour of the light emitting device 222. That is, the height of the luminescent material 223 formed on the package body 221 is lower than the height of the luminescent material 223 formed on the light emitting device 222.

According to another example of the light emitting apparatus of the second embodiment, the luminescent material 223 having a predetermined thickness surrounds the light emitting device 222, so color deviation of the light emitted from the light emitting apparatus can be reduced.

Figure 20:
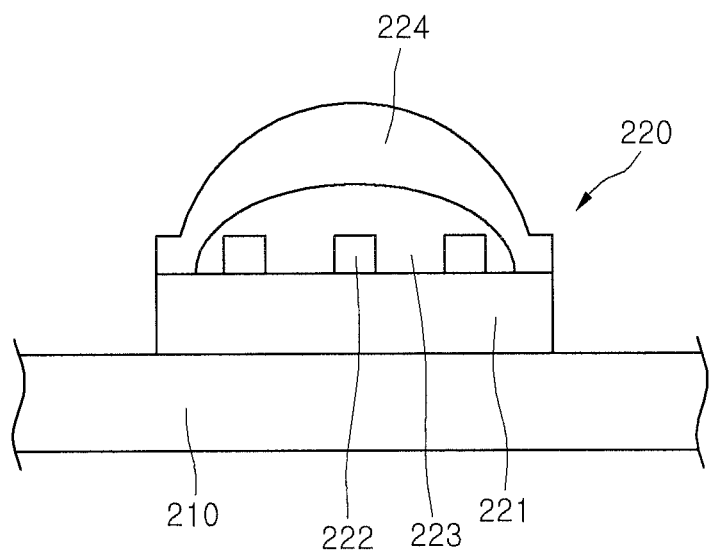
FIG. 20 is a view showing still another example of a light emitting apparatus according to the second embodiment.

FIG. 20 is a view showing another example of a light emitting apparatus according to the second embodiment. In FIG. 20, a lens is omitted.

In the following description, the elements and structures that have already been described with reference to FIGS. 16 and 17 will not be further described in order to avoid redundancy.

Referring to FIG. 20, according to another example of the light emitting apparatus of the second embodiment, the light emitting device package 220 includes a package body 221 and a luminescent material 223 formed on a light emitting device 222 with a convex shape.

According to another example of the light emitting apparatus of the second embodiment, the luminescent material 223 can be formed through the dispensing scheme, so that the manufacturing process can be simplified.

Figure 21:
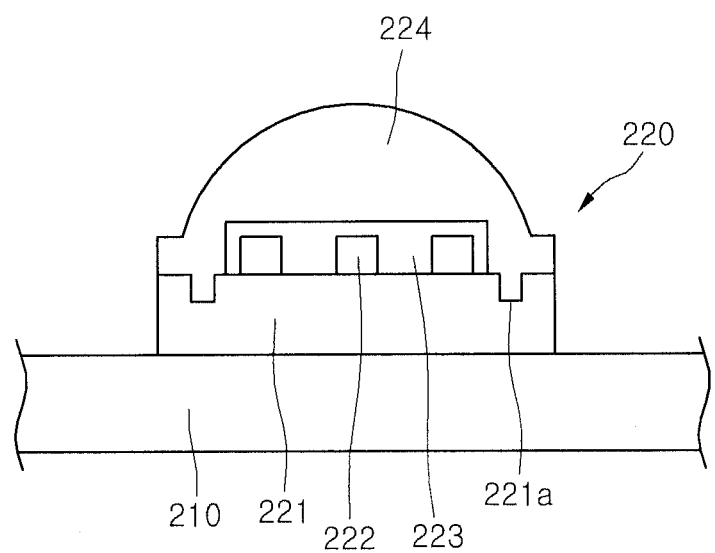
FIG. 21 is a view showing still another example of a light emitting apparatus according to the second embodiment.

FIG. 21 is a view showing another example of a light emitting apparatus according to the second embodiment. In FIG. 21, a lens is omitted.

In the following description, the elements and structures that have already been described with reference to FIGS. 16 and 17 will not be further described in order to avoid redundancy.

Referring to FIG. 21, according to another example of the light emitting apparatus of the second embodiment, the light emitting device package 220 includes a package body 221 formed on the top surface thereof with slots 221a and an encapsulant 224 filled in the slots 221a. Thus, the contact area between the encapsulant 224 and the package body 221 may be enlarged and the encapsulant 224 can be securely coupled with the package body 221.

Although FIG. 21 shows the slots 221a formed on the top surface of the package body 221, the slots 221a can be formed at the lateral sides of the package body 221. In addition, protrusions can be formed instead of the slots 221a.

Figure 22:
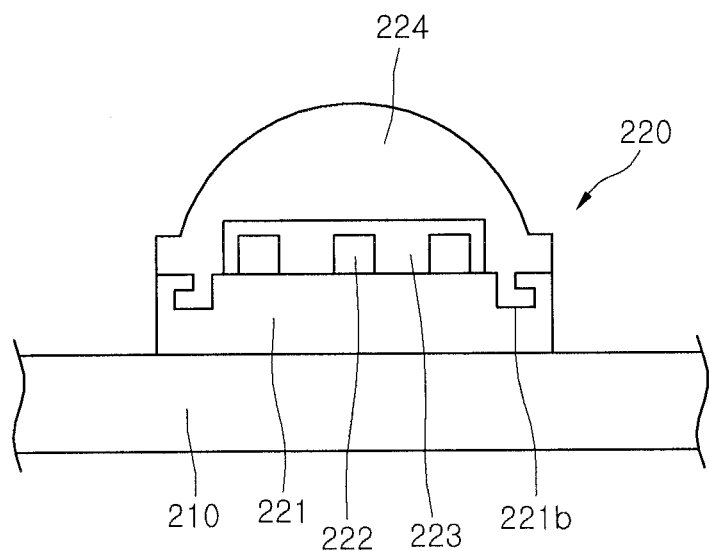
FIG. 22 is a view showing still another example of a light emitting apparatus according to the second embodiment.

FIG. 22 is a view showing another example of a light emitting apparatus according to the second embodiment. In FIG. 22, a lens is omitted.

In the following description, the elements and structures that have already been described with reference to FIGS. 16 and 17 will not be further described in order to avoid redundancy.

Referring to FIG. 22, according to another example of the light emitting apparatus of the second embodiment, the light emitting device package 220 includes a package body 221 formed on the top surface thereof with dual slots 221b and an encapsulant 224 filled in the dual slots 221b. The dual slots 221b perpendicularly extend downward from the top surface of the package body 221 and then horizontally extends.

Thus, the contact area between the encapsulant 224 and the package body 221 may be enlarged and the encapsulant 224 filled in the dual slots 221b may serve as a locking unit, so that the encapsulant 224 can be securely coupled with the package body 221.

Figure 23:
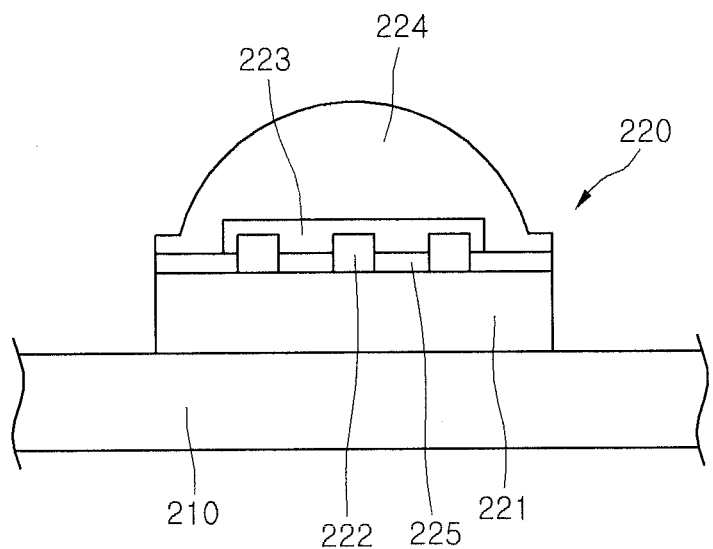
FIG. 23 is a view showing still another example of a light emitting apparatus according to the second embodiment.

FIG. 23 is a view showing another example of a light emitting apparatus according to the second embodiment. In FIG. 23, a lens is omitted.

In the following description, the elements and structures that have already been described with reference to FIGS. 16 and 17 will not be further described in order to avoid redundancy.

Referring to FIG. 23, according to another example of the light emitting apparatus of the second embodiment, the light emitting device package 220 includes a package body 221 and a reflective structure 225 formed on the top surface of the package body 221. The reflective structure 225 may include a metal or ink having high reflectivity. The reflective structure 225 may reduce the amount of light absorbed in the package body 221, so that the light efficiency of the light emitting apparatus can be improved.

Figure 24:
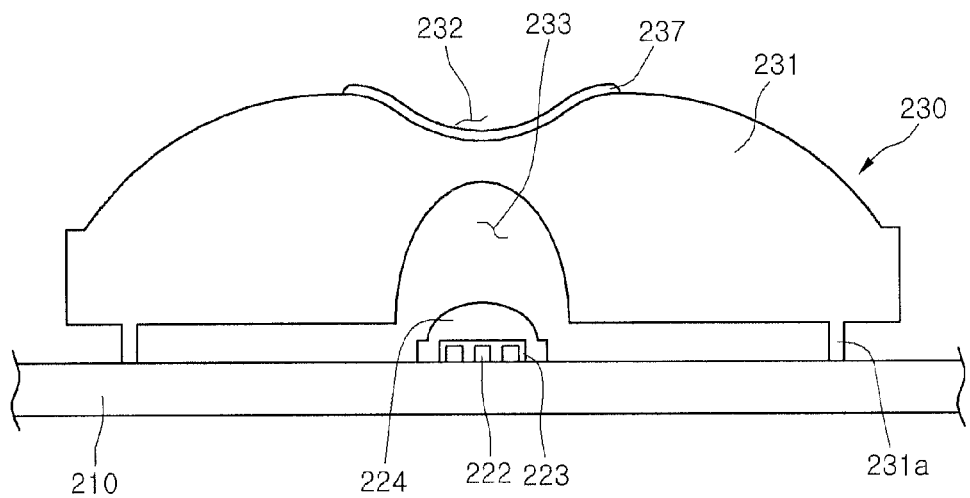
FIG. 24 is a view showing still another example of a light emitting apparatus according to the second embodiment.

FIG. 24 is a view showing another example of a light emitting apparatus according to the second embodiment.

In the following description, the elements and structures that have already been described with reference to FIGS. 16 and 17 will not be further described in order to avoid redundancy.

Referring to FIG. 24, the light emitting apparatus according to another example of the second embodiment is formed through the COB (chip on board) scheme. That is, a light emitting device 222 is directly mounted on the substrate 210, and a luminescent material 223 is formed on the substrate 210 to surround the light emitting device 222. In addition, an encapsulant 224 is formed on the substrate 210 to surround the luminescent material 223.

The encapsulant 224 makes contact with the substrate 210 and a part of the encapsulant 224 is filled in the second recess 233.

Different from the light emitting apparatus shown in FIGS. 16 and 17, according to another example of the light emitting apparatus of the second embodiment, the light emitting device 222 is directly mounted on the substrate 210 without being packaged by using the package body 221.

Thus, the light generated from the light emitting device 222 can be emitted with wider orientation angle and heat generated from the light emitting device 222 can be effectively dissipated to the outside through the substrate 210.

Figure 25:
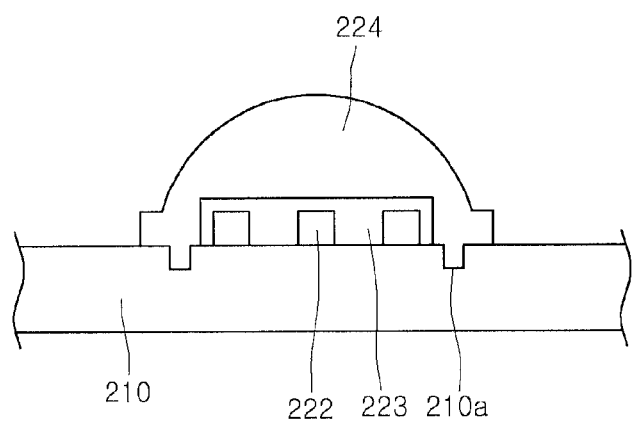
FIG. 25 is a view showing still another example of a light emitting apparatus according to the second embodiment.

FIG. 25 is a view showing another example of a light emitting apparatus according to the second embodiment.

In the following description, the elements and structures that have already been described with reference to FIGS. 16 and 17 will not be further described in order to avoid redundancy. In FIG. 25, the lens 230 is omitted.

Referring to FIG. 25, the light emitting apparatus according to another example of the second embodiment is formed through the COB (chip on board) scheme. That is, a light emitting device 222 is directly mounted on the substrate 210, and a luminescent material 223 is formed on the substrate 210 and the light emitting device 222 to surround the light emitting device 222.

In addition, an encapsulant 224 is formed on the substrate 210 and the luminescent material 223 to surround the luminescent material 223. A part of the encapsulant 224 is provided in the second recess 233.

The substrate 210 is formed thereon with slots 231a and the encapsulant 224 is filled in the slots 231a. Thus, the contact area between the encapsulant 224 and the substrate 210 may be enlarged and the encapsulant 224 can be securely coupled with the substrate 210 and the luminescent material 223.

Figure 26:
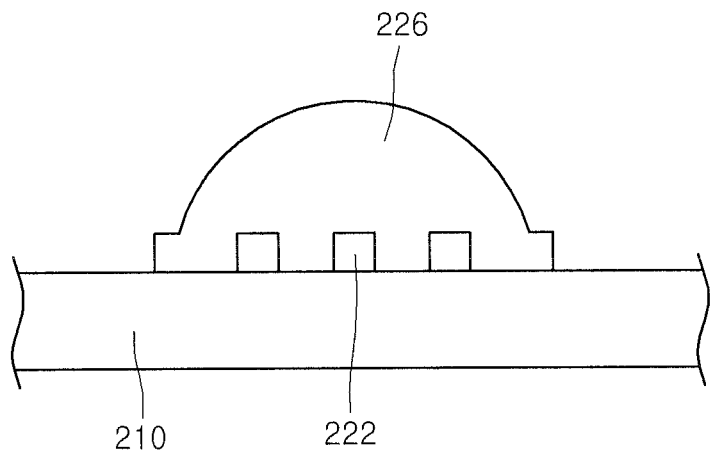
FIG. 26 is a view showing still another example of a light emitting apparatus according to the second embodiment.

FIG. 26 is a view showing another example of a light emitting apparatus according to the second embodiment.

In the following description, the elements and structures that have already been described with reference to FIGS. 16 and 17 will not be further described in order to avoid redundancy. In FIG. 26, the lens is omitted.

Referring to FIG. 26, the light emitting apparatus according to another example of the second embodiment is formed through the COB (chip on board) scheme. That is, a light emitting device 222 is directly mounted on the substrate 210, and a luminescent material encapsulant 226 is formed on the substrate 210 and the light emitting device 222 to surround the light emitting device 222.

The luminescent material encapsulant 226 is formed in a convex shape by dispensing an encapsulant having the luminescent material distributed therein. Thus, the luminescent material encapsulant 226 may have the function of the luminescent material and the encapsulant. According to another example of the second embodiment, the manufacturing process can be simplified.

Figure 27:
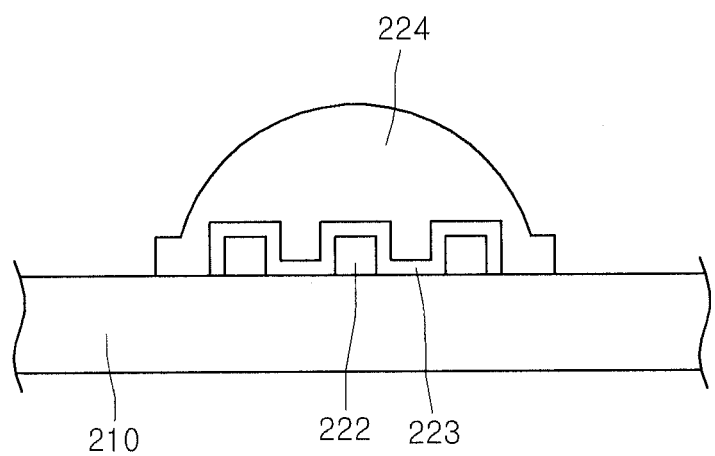
FIG. 27 is a view showing still another example of a light emitting apparatus according to the second embodiment.

FIG. 27 is a view showing another example of a light emitting apparatus according to the second embodiment.

In the following description, the elements and structures that have already been described with reference to FIGS. 16 and 17 will not be further described in order to avoid redundancy. In FIG. 27, the lens is omitted.

Referring to FIG. 27, the light emitting apparatus according to another example of the second embodiment is formed through the COB (chip on board) scheme. That is, a light emitting device 222 is directly mounted on the substrate 210, and a luminescent material 223 having a predetermined thickness is formed on the substrate 210 and the light emitting device 222 to surround the light emitting device 222.

In addition, an encapsulant 224 is formed on the substrate 210 and the luminescent material 223 to surround the luminescent material 223. A part of the encapsulant 224 is provided in the second recess 233.

The luminescent material 223 is disposed in a corrugate shape along the contour of the light emitting device 222. That is, the height of the luminescent material 223 formed on the substrate 210 is lower than the height of the luminescent material 223 formed on the light emitting device 222.

According to another example of the light emitting apparatus of the second embodiment, the luminescent material 223 having the predetermined thickness surrounds the light emitting device 222, so color deviation of the light emitted from the light emitting apparatus can be reduced.

Figure 28:
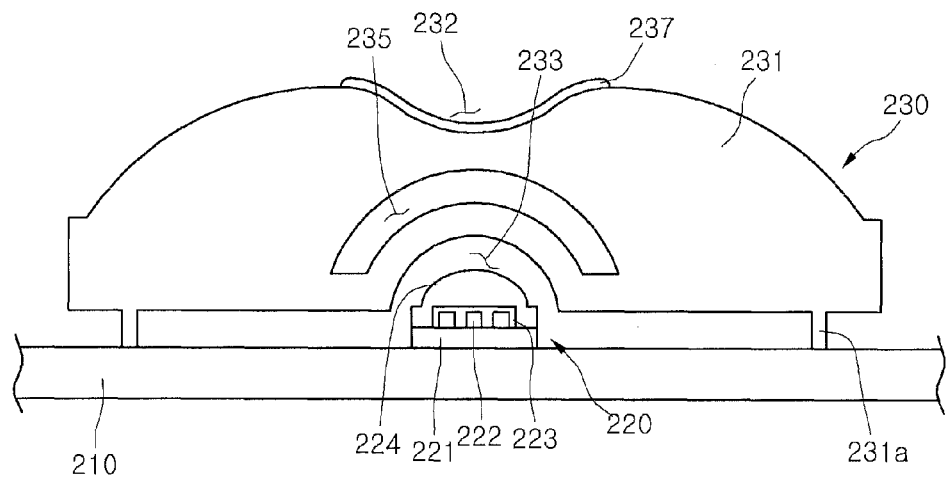
FIG. 28 is a view showing still another example of a light emitting apparatus according to the second embodiment.

FIG. 28 is a view showing another example of a light emitting apparatus according to the second embodiment.

In the following description, the elements and structures that have already been described with reference to FIGS. 16 and 17 will not be further described in order to avoid redundancy.

Referring to FIG. 28, the light emitting apparatus according to another example of the second embodiment includes a lens 230 having a lens body 231 formed therein with a gap 235 and a lens supporter 231a to support the lens body 231.

When viewed in the plan view, the lens body 231 has a substantially circular shape. In addition, a concave-convex section or roughness can be formed on the bottom surface of the lens body 231.

A plurality of lens supporters 231a can be provided on the bottom surface of the lens body 231. Although only two lens supporters 231a are shown in FIG. 28, at least three lens supporters 231a can be provided while being spaced apart from each other to stably support the lens body 231. The number and shape of the lens supporter 231a may be changed according to the design of the light emitting apparatus.

The lens body 231 includes a transparent resin material and is spaced apart from the substrate 210 by the lens supporter 231a. The lens supporters 231a can be securely attached to the substrate 210 by using an adhesive.

The upper surface of the lens body 231 is generally convex and a first recess 232, which is concaved downward, is formed at the center of the upper surface of the lens body 231. A reflective structure 237 can be formed in the first recess 232. The first recess 232 may be fully or partially filled with the reflective structure 237.

In addition, the lens body 231 has a planar bottom surface and a second recess 233, which is concaved upward, is formed at the center of the bottom surface of the lens body 231. The first recess 232 overlaps with the second recess 233 in the vertical direction and the gap 235 is formed between the first and second recesses 232 and 233.

In addition, the outer peripheral portion of the upper surface of the lens body 231 may be planarized and the lateral sides of the lens body 231 may be perpendicular to the bottom surface of the lens body 231.

The light generated from the light emitting device 222 is reflected and refracted while travelling toward the reflective structure 237 of the first recess 232 by passing through the second recess 233 and the gap 235. Thus, the amount of light directed in the upward direction may be reduced, so that a greater amount of light can be emitted in the lateral direction.

Figure 29:
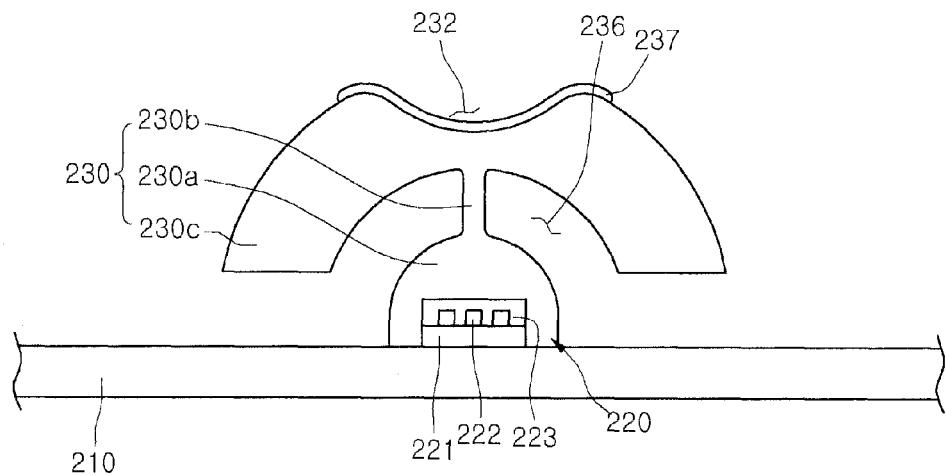
FIG. 29 is a view showing still another example of a light emitting apparatus according to the second embodiment.

FIG. 29 is a view showing another example of a light emitting apparatus according to the second embodiment.

In the following description, the elements and structures that have already been described with reference to FIGS. 16 and 17 will not be further described in order to avoid redundancy.

Referring to FIG. 29, the light emitting apparatus according to another example of the second embodiment includes a substrate 210, a light emitting device package 220 installed on the substrate 210, and a lens 230 installed over the light emitting device package 220 while being supported by the substrate 210.

The light emitting device package 220 includes a package body 221, at least one light emitting device 222 installed on the package body 221, a luminescent material 223 surrounding the light emitting device 222.

The lens 230 includes an encapsulant part 230a formed on the substrate 210 and the light emitting device package 220 to surround the light emitting device package 220, a lens part 230c provided above the encapsulant part 230a, and a support part 230b connecting the encapsulant part 230a to the lens part 230c while supporting the lens part 230c.

The lens 230 may include a transparent resin material, such as epoxy resin or silicone resin. The encapsulant part 230a, the lens part 230c, and the support part 230b may be integrally formed with each other through injection molding, or separately formed from each other and then bonded with each other by using an adhesive.

The upper surface of the lens part 230c is convex and a first recess 232 is formed at the center of the upper surface of the lens part 230c. A reflective structure 237 is formed in the first recess 232.

The lens part 230c is spaced apart from the encapsulant part 230a, so that a gap 236 is formed between the lens part 230c and the encapsulant part 230a.

The encapsulant part 230a may improve extraction efficiency of light emitted from the light emitting device 222 while protecting the light emitting device 222.

The light emitted from the light emitting device 222 is reflected and refracted while travelling through the encapsulant part 230a, the gap 236 and the lens part 230c, so that the amount of light directed in the upward direction may be reduced. Thus, the light emitting apparatus can emit a greater amount of light in the lateral direction.

Figure 30:
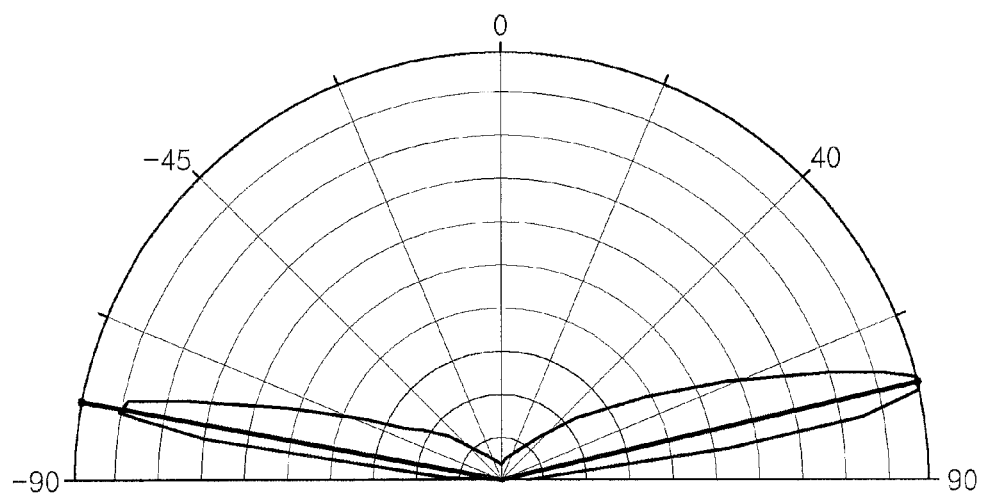
FIGS. 30 and 31 are views for explaining light distribution characteristics of a light emitting apparatus according to the second embodiment.
Figure 31:
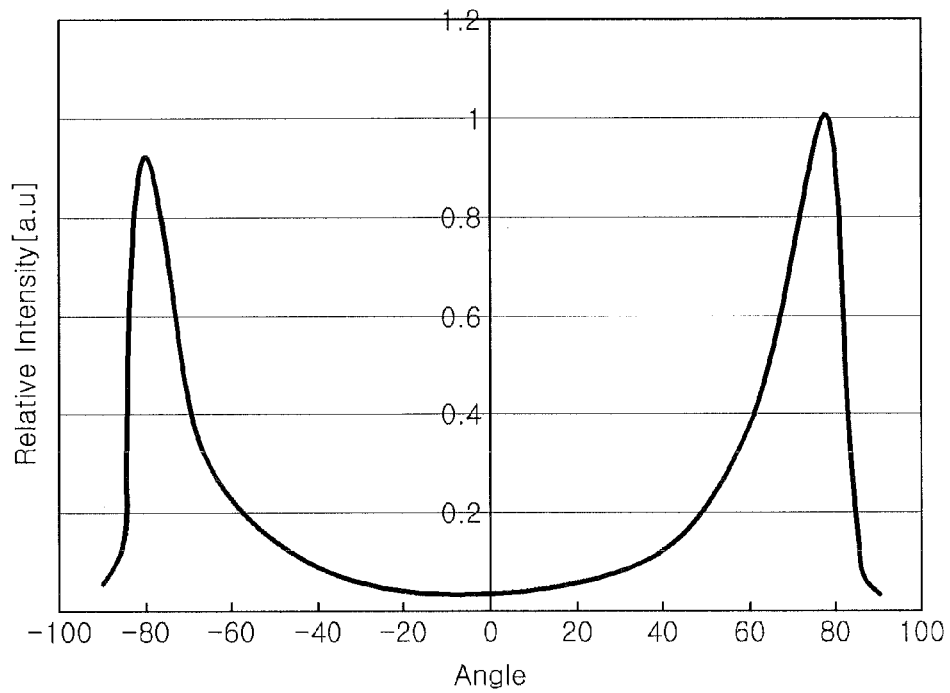

FIGS. 30 and 31 are views for explaining light distribution characteristics of the light emitting apparatus according to the second embodiment.

As shown in FIGS. 30 and 31, when the direction perpendicular to the substrate 210 is set to 0°, the light emitting apparatus according to the second embodiment shown in FIGS. 16 and 17 emits peak light at the angle of 70° to 85° or −70° to −85°. That is, the light generated from the light emitting apparatus is mainly emitted in the lateral direction.

Meanwhile, the light emitting apparatus shown in FIGS. 18 to 29 may have the light distribution characteristics shown in FIGS. 30 and 31.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus comprising:
a package body;
a first electrode and a second electrode disposed in the package body;
at least one light emitting device electrically coupled to the first electrode and the second electrode and disposed on one of the first electrode and the second electrode; and
a lens over the package body and including a recess formed on a top surface, the recess being concave downward, wherein:
the package body includes a first cavity, a first end of the first electrode and a first end of the second electrode are exposed in the first cavity and a second end of the first electrode, and a second end of the second electrode are exposed at lateral sides of the package body, respectively,
a reflective structure is disposed at the recess and includes both an organic material and an inorganic material,
a second cavity is formed at a predetermined portion of the first electrode exposed in the first cavity, and
a largest width of the reflective structure is smaller than a largest width of the second cavity.

2. The light emitting apparatus as claimed in claim 1, wherein at least a part of a bottom surface of each of the first electrode and the second electrode is disposed on substantially a same plane with a bottom surface of the package body.

3. The light emitting apparatus as claimed in claim 1, wherein at least a part of the reflective structure overlaps with the light emitting device in a vertical direction.

4. The light emitting apparatus as claimed in claim 1, wherein the reflective structure includes at least one of $TiO_2$, $SiO_2$, Al, $Al_2O_3$, Ag or Ti.

5. The light emitting apparatus as claimed in claim 1, further comprising a luminescent material layer and an encapsulant between the light emitting device and the lens.

6. The light emitting apparatus as claimed in claim 5, wherein:
the luminescent material layer comprises at least two luminescent layers, and
a first luminescent layer of the at least two luminescent layers which is closer to the light emitting device emits light having a shorter wavelength than a second luminescent layer which is farther away from the light emitting device.

7. The light emitting apparatus as claimed in claim 1, further comprising a luminescent material layer that includes at least two types of luminescent materials, and wherein the light emitting device includes a blue light emitting diode chip that emits a blue light.

8. The light emitting apparatus as claimed in claim 7, wherein the luminescent material layer includes a first luminescent layer, a second luminescent layer and a third luminescent layer, in which the first luminescent layer emits a green light having FWHM (full width at half-maximum) of substantially 50 to 100 nm, the second luminescent layer emits a yellow light having the FWHM of substantially 50 to 100 nm, and the third luminescent layer emits a red light having the FWHM of substantially 80 to 110 nm.

9. The light emitting apparatus as claimed in claim 8, wherein the first luminescent layer, the second luminescent layer and the third luminescent layer are spaced apart from the light emitting device while being spaced apart from each other.

10. The light emitting apparatus as claimed in claim 7, wherein the blue light emitting diode chip emits the blue light having FWHM of substantially 15 to 40 nm.

11. The light emitting apparatus as claimed in claim 1, wherein the light emitting device is disposed on the second cavity.

12. The light emitting apparatus as claimed in claim 1, wherein the light emitting device is disposed on the second cavity and the second cavity is positioned under the first cavity.

13. The light emitting apparatus as claimed in claim 1, wherein a largest width of the recess is smaller than the largest width of the second cavity and wherein the recess overlaps the second cavity in a vertical direction.

14. The fight emitting apparatus as claimed in claim 1, further including:
a first encapsulant layer disposed over the fight emitting device;
a first luminescent layer disposed over the first encapsulant layer;
a second encapsulant layer disposed over the first luminescent layer; and
a second luminescent layer disposed over the second encapsulant layer.

15. A light emitting apparatus comprising:
a package body have a first cavity and a second cavity;
a first electrode and a second electrode disposed in the package body;
a light emitting device electrically coupled to the first electrode and the second electrode and disposed on the second cavity; and
a lens over the package body and having a recess, wherein a first end of the first electrode and a first end of the second electrode are exposed in the first cavity, and a second end of the first electrode and a second end of the second electrode are exposed through a first side surface and a second side surface of the package body, respectively,
wherein the package body has a first body and a second body provided under the first body, the first cavity is surrounded by the first body formed with a nonmetal material and the second cavity is surrounded by the second body,
wherein the lens has a reflective structure with reflective material disposed on the recess,
wherein a largest width of the reflective structure is smaller than a largest width of the second cavity,
wherein the second cavity is disposed on one of the first electrode and the second electrode, and
wherein a width of the recess is smaller than a width of the second cavity.

16. The light emitting apparatus as claimed in claim 15, wherein the recess is formed on a top surface of the lens.

17. The light emitting apparatus as claimed in claim 15, wherein the second cavity is positioned under the first cavity.

18. The light emitting apparatus as claimed in claim 15, further including
a luminescent material and an encapsulant positioned between the light emitting device and the lens.

19. The light emitting apparatus as claimed in claim 15, wherein the reflective structure includes an organic material and an inorganic material.

20. The light emitting apparatus as claimed in claim 15, wherein the recess overlaps the second cavity in a vertical direction.

21. The light emitting apparatus as claimed in claim 15, further including:
a first encapsulant layer disposed over the light emitting device;
a first luminescent layer disposed over the first encapsulant layer;
a second encapsulant layer disposed over the first luminescent layer; and
a second luminescent layer disposed over the second encapsulant layer.

* * * * *